United States Patent [19]
Matsuoka et al.

[11] Patent Number: 5,391,508
[45] Date of Patent: Feb. 21, 1995

[54] METHOD OF FORMING SEMICONDUCTOR TRANSISTOR DEVICES

[75] Inventors: Toshimasa Matsuoka, Yao; Hiroshi Kotaki; Seizo Kakimoto, both of Nara, all of Japan

[73] Assignee: Sharp Kabushiki Kaisha, Osaka, Japan

[21] Appl. No.: 170,771

[22] Filed: Dec. 21, 1993

[30] Foreign Application Priority Data

Dec. 21, 1992 [JP] Japan .................................. 4-339913
Jul. 28, 1993 [JP] Japan .................................. 5-185946

[51] Int. Cl.$^6$ .......................................... H01L 21/265
[52] U.S. Cl. ............................... 437/41; 437/35; 437/44; 437/242; 437/968; 257/336
[58] Field of Search ............... 437/35, 41, 44, 43, 437/62, 29, 913, 968, 242; 257/336, 900

[56] References Cited

U.S. PATENT DOCUMENTS 5,073,514 12/1991 Ito et al. ................................. 437/35
5,089,435  2/1992 Akiyama .
5,145,798  9/1992 Smayling et al. ..................... 437/44

FOREIGN PATENT DOCUMENTS 62-113474  5/1987 Japan .
63-296278 12/1988 Japan .
3-070139  3/1991 Japan .
3-145137  6/1991 Japan .

OTHER PUBLICATIONS

"Deep Submicron NMOSFETs Using Novel Locally Elevated Drain (LED) and Silicided LED (SLED) Structure", by S. Kakimoto et al, *The Drafted Thesis for the 54th Applied Physics Institution Science Lecture in Autumn, 1993;* Sep. 27–30, 1993; p. 727; published by Hokkaido University.

*Primary Examiner*—George Fourson
*Assistant Examiner*—David Mason

[57] ABSTRACT

A method of forming semiconductor devices comprising the steps of forming, by restriction in the increased number of steps by a process close to the normal process, a field effect transistor having a local shallow source/drain diffusion layer on both the sides of a gate electrode for self-matching operation and without etching damages, wherein impurities are ion-implanted onto the semiconductor side wall and onto the substrate surface of both the sides, and thermal treatment operation is effected so as to form the local shallow source/-drain diffusing layers by the diffusion for activating the impurities of the deep shallow source drain diffusing layers, thereby to render to be capable of restraining a short channel effect and reducing the parasitic resistance of the semiconductor devices.

4 Claims, 9 Drawing Sheets

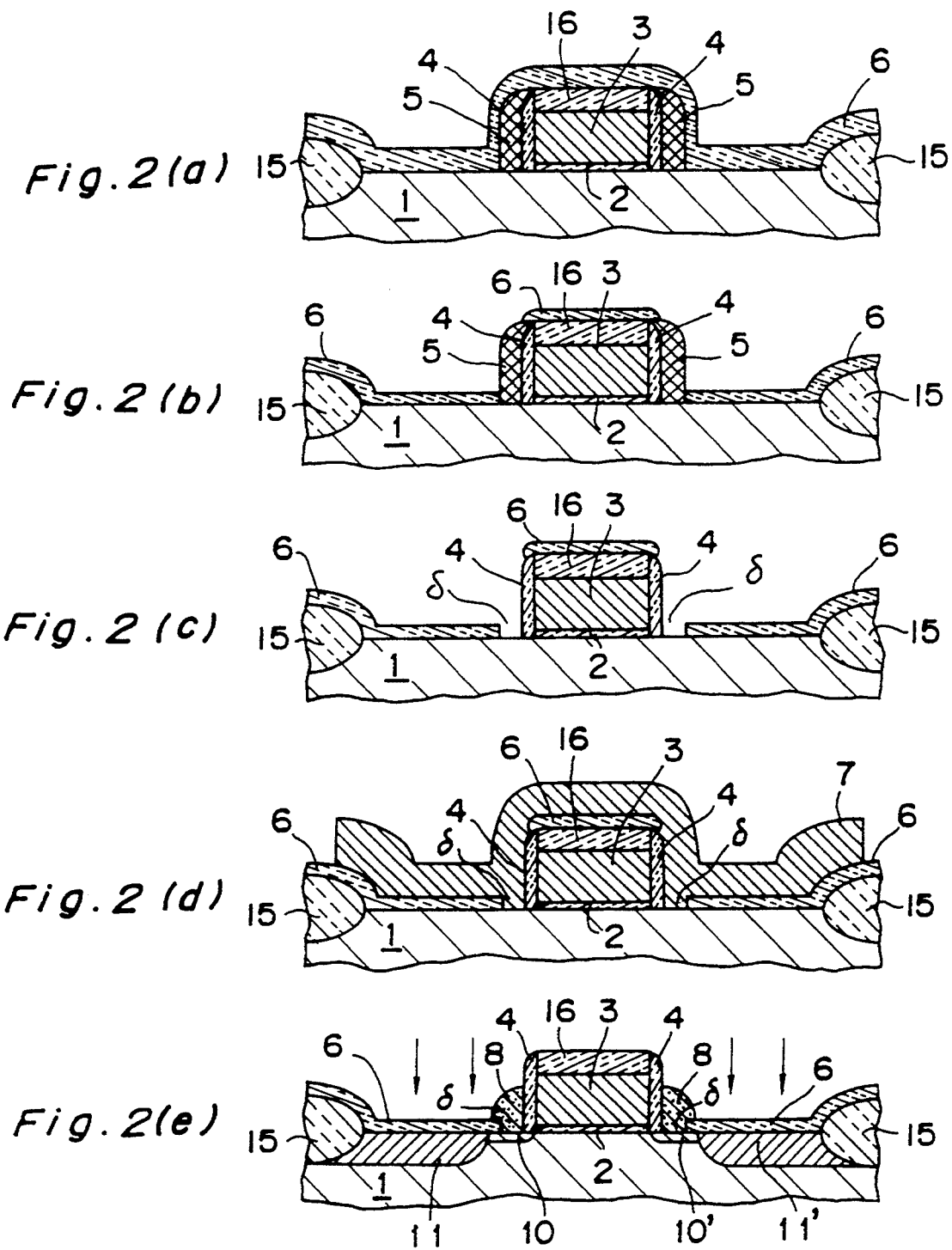

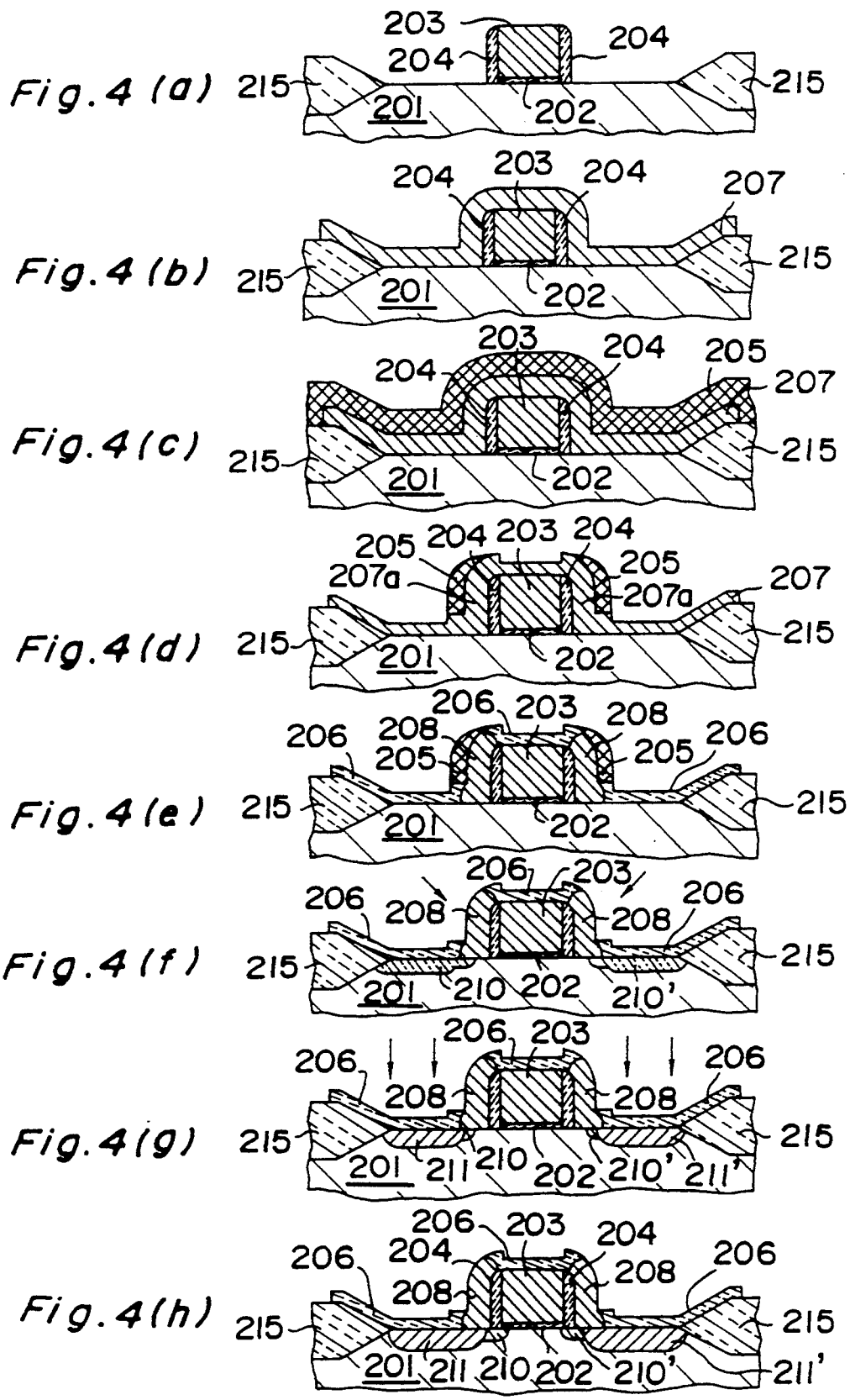

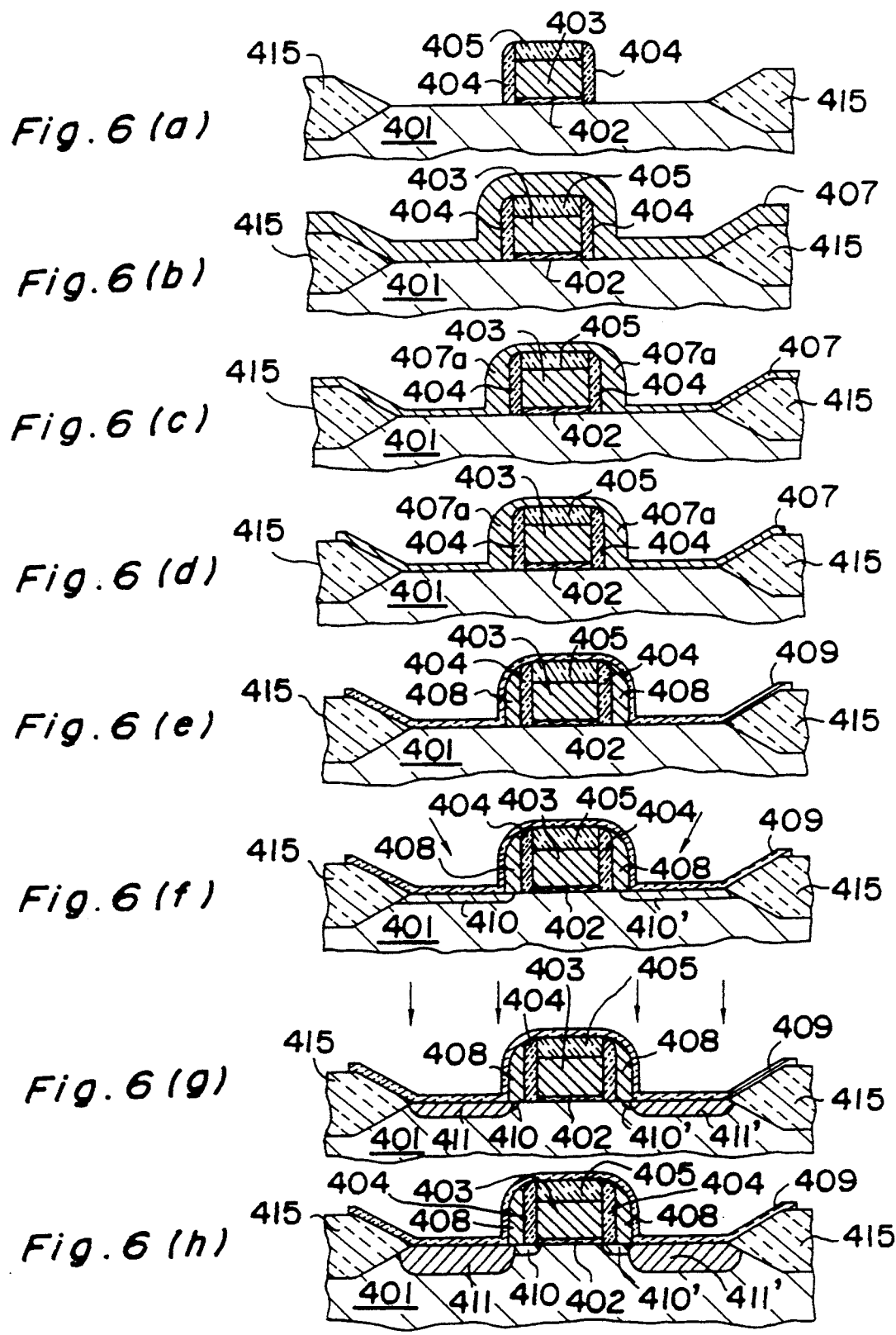

1

METHOD OF FORMING SEMICONDUCTOR TRANSISTOR DEVICES

BACKGROUND OF THE INVENTION

The present invention generally relates to a method of forming a semiconductor device, and more particularly, to a method of forming an insulated gate field effect transistor (MOSFET).

Generally a semiconductor integrated circuit often includes insulated gate field effect transistors as semiconductors. A semiconductor integrated circuit prevailed at present has problems of deterioration in transistor characteristics due to short channel effect such as dispersion of threshold voltage by variation in gate length, increase in leak current due to deterioration of subthreshold characteristics, which are caused by miniaturization of the devices.

In order to solve the problems, a shallow source/drain junction is known to be effective. Conventionally methods of (1) reduction in source/drain implanting energies
(2) control of diffusion on activation annealing with the use of rapid thermal annealing such as lamp heating or the like
(3) formation of recess type elevated diffusion layer structure transistor
(4) formation of poly Si pasting source drain diffusion layer structure
(5) formation of locally elevated source/drain structure or the like are effected for shallow junction formation.

For example, FIG. 8 shows a step for making an insulated gate field effect transistor by the adoption of the above described (4). As shown in FIG. 8(a), a gate insulation film 80, a gate electrode 82 having an oxide mask 85 are formed by a normal step on the surface of the Si substrate 81, and thereafter, oxide film side walls 83, 83 are formed on both the sides of a gate electrode 82 with deposition and anisotropy etch-back of oxide films. Then, a poly Si film 86 is deposited on it. As shown in FIG. 8(b), a photolithography operation is effected so as to provide resists R1, R1 in active regions (where the source/drain are formed) on both the sides of a gate electrode 82. As shown in FIG. 8(c), etching operation is effected with the resists R1, R1 as masks so as to form the pasting poly Si films 86a, 86a. Finally, an ion implantation operation is effect approximately vertically into the substrate surface as shown in FIG. 8(d) so as to continuously effect an activation annealing operation for forming source/drain diffusion layers 87, 87'.

FIG. 9 shows a step of making an insulated gate field effect transistor by adoption of the above described (5). As shown in FIG. 9(a), a gate insulation film 90 and a gate electrode 93 are formed by a normal step on a Si substrate 91. Thereafter, an oxidating operation is effected so as to form oxide films 92, 92 in the active regions on both the sides of the gate electrode 93, and also, oxide films 95 and 94, 94 respectively on the surface and both the side faces of the gate electrode 93. The photolithography operation is effected so as to have resists R2, R3, in a condition of spaced relation from the gate electrode 93, in the active regions of both the sides of the gate electrode 93. The oxide film 92 is etched with the resists R2, R2 and the oxide film on the gate electrode surface as masks so as to form opening portions Δ, Δ' on both the sides of the gate electrode 92. Continuously, as shown in FIG. 9(b), the resists R2, R2

2 are removed, thereafter, doped poly Si (not shown) is deposited, on its entire face, on it so as to diffuse impurities, to be included in the above described doped poly Si on the substrate surface, by a thermal treating operation through the above described opening portions Δ, Δ'. Local shallow source/drain diffusion layers 96, 96' are formed on both the sides of the gate electrode 93. Thereafter, an anisotropical etch-back operation is effected so as to form locally elevated layer side walls 97, 97 in electric contact with the local shallow source/drain diffusion layers 96, 96' on both the sides of the gate electrodes 93 (accurately oxide films 94, 94). As shown in FIG. 9(c), impurities are ion-implanted deeper than the depth of the above described local shallow source/drain diffusion layers 96, 96' approximately vertically on the substrate surface with the gate electrode 93 and locally elevated layer side walls 97, 97 as masks so as to form the source/drain diffusion layer 98, 98' coupled to both the sides of the above described local shallow source/drain diffusion layers 96, 96'. Finally, as shown in FIG. 9(d), a thermal treatment operation is effected so as to activate the implanted impurities.

Although a short channel effect can be restricted simply by realizing the shallow Junction of the source/drain, the diffusion layer resistance increases so as to deteriorate the performance of the devices. Such a problem exists in the shallow junction of the source/drain by the methods of the above described (1) through (2).

The above described (1) method has a bottom limit in energies which can be controlled with ion implanting energies. Low energies have a problem of extent of impurity ions by a channeling phenomenon. The reduction of diffusion layer depth is restricted so that the desired shallow Junction cannot be effected.

The method of the above described (2) has an effect in the restraint of the diffusion by the contraction of the diffusion time. When the ion implanting operation is used into the impurity implanting operation, the influences of the channeling cannot be avoided as in the above described (1). Therefore, the reduction of diffusion layer depth is restricted and the desired Junction cannot be effected.

In order to effect the shallow junction by the recess type structure of the above describe (3), a diffusion layer is formed in a layer upper than the channel face, a portion, which exists in a channel region, of the diffusion layer is removed by a recess etching operation, thereafter the poly Si is deposited on the whole face so as to form a gate electrode by a patterning, so that the channel region and the diffusion layer portion, the gate electrode cannot be formed for self-matching operation. Therefore, there are problems of increment of area by alignment margin, dispersion of characteristics by alignment shift, and so on. As the structure is of recess, difference from the normal process is larger. Further, there are problems such as etching damages of the channel portion, deterioration of flatness of the active region, and so on.

As the method of the above described (4) has a step of forming pasting poly Si films 86a, 86a on a layer upper than the substrate surface as described shown in FIG. 8, introducing impurities into the substrate 81 by diffusion from the poly Si films 86a, 86a and forming the source/drain diffusion layers 87, 87', this is extremely effective for shallow Junction formation without receiving the influences of the channeling at the introduction of the impurities, which is different from a case of the formation by the ion implanting operation. As the method is a normal process till the formation of the gate electrode 82, a problem to be caused due to the recess structure formation is not caused, which is different from a method of the above described (3). As the poly Si film 86 deposited on the whole face after the gate formation is patterned by a photolithographic operation, the pasting poly Si films 86a, 86a are hard to form due to the separation resolution limit and alignment shift of the source/drain in the miniaturization of the gate 82. As the pasting poly Si films 86a, 86a and the gate 82 (and active region) are not formed in self-aligned manner, which causes characteristic dispersion due to alignment shift, deterioration of packing density by the requirement of the alignment margin, and so on.

As the above described (5) method has a step of forming Junction 96, 96' closer to the channel with the diffusion from a layer upper than the substrate surface as shown in FIG. 9, it was effective in the shallow Junction formation as in the above described (4) method. Since it forms locally elevated layer side walls 97, 97 in self-aligned manner with respect to the gate 93, which is different from the above described (4) method, characteristics dispersion due to the alignment shift is not caused. When the thickness (thickness in a direction parallel to the substrate surface) of the locally elevated layer side walls 97, 97 is set smaller than the width of the opening portions Δ, Δ' as shown in FIG. 9(b), the surface of the Si substrate 91 is etched by an over etching operation through the opening portions Δ, Δ' in the formation of the locally elevated layer side walls 97, 97 by the anisotropical etch-back operation, thus causing leakage due to etching damages, increasing in Junction depth, and so on. In the worst case, the shallow Junction is completely etched, thus resulting in bad conduction. Since the width of the above described opening portions Δ, Δ' is set slightly wider considering alignment shifts and so on accompanied by the photolithography when the thickness of the locally elevated layer side walls 97, 97 is set larger than the opening portions Δ, Δ', freedom degree for selecting the thickness of the local accumulating layer side walls 97, 97 is reduced (thickness has to be increased). The locally elevated layer side walls 97, 97 in electric contact with the shallow junction is formed even on the gate electrode (not shown) on the isolation region. In order to remove the side walls on the isolation region so as to obtain the insulation of the source/drain, the photolithography and the etching are required for special use. As a result, the above described (5) method has the step of complicating the process and increasing the cost, because twice photolithography increases as compared with the normal process, in addition to the photolithography for forming the opening portions Δ, Δ'.

SUMMARY OF THE INVENTION

Accordingly, the present invention has been developed with a view to substantially eliminating the above discussed drawbacks inherent in the prior art and for its essential object to provide an improved method of forming semiconductor devices.

Another important object of the present invention is to provide an improved method of forming semiconductor devices comprising the steps capable forming, by restraint in the increased number of processes, with a process less in difference from the normal MOSFET process, a field effect transistor having local shallow source/drain diffusion layer on both the sides of a gate electrode for self-align operation and without etching-damages.

Still another object of the present invention is to provide an improved method of forming semiconductor devices having a step capable of restraining a short channel effect without increasing in diffusion layer resistance.

A further object of the present invention is to provide an improved method of forming semiconductor devices having a step capable of retraining the electric current driving force reduction of devices due to shallow splicing operation.

In accomplishing these and other objects, according to preferred embodiments of the present invention, there are provided a method of forming semiconductor devices, described in the first invention, comprising a step of forming active regions by blocking the surface of the semiconductor substrate and forming an approximately rectangular (sectional) gate electrode through a gate insulating film in approximately center of the above described active region, a step of forming a first side wall insulating film on both the side faces of the above described gate electrode, a step of forming a second side wall insulating film, composed of a material different in etching selectivity from the above described first side wall insulation film, on the exposed side face of the above described first side wall insulating film, a step of depositing a protective insulating film composed of a material different in etching selectivity from the second side wall insulating film, on the substrate, into a condition where the thickness of a portion covering a side face of second side wall smaller than that of a portion for covering a flat face, a step of effecting an isotropic etching operation with respect to the above described protective insulating film so as to expose the side face of the above described second side wall insulating film, while leaving with some thickness a portion existing on the surface of the above described gate electrode and the substrate surface of the above described active region of the above described protective insulating film, a step of selectively etching, removing the above described second side wall insulating film with respect to the above described first side wall insulating film and the protective insulating film so as to form an opening portion for exposing the above described substrate surface on both the sides of the first side wall insulating film, a step of depositing the semiconductor film, on the above described substrate, with approximate uniform thickness and in a condition of burying the above described opening portion, a step of effecting a anisotropical etching operation with respect to the above described semiconductor film so as to form a semiconductor side wall in contact with the above described first side wall for covering the above described opening portion, a step of introducing conductive type impurities different from the conductive type of the above described substrate, within a mask in a region where the above described masks exists, with the gate electrode, with the above described gate electrode, the first side wall insulating film and the semiconductor side wall as a masks, while implanting ions into the above described substrate with accelerating energies reaching the substrate surface through the above described protective insulating film in the active regions on both the sides of the above described masks, a step of effecting a thermal treating operation, diffusing impurities implanted into the above described semiconductor side wall onto the substrate surface through the above described opening portion, forming a local shallow source/drain diffusing layer on both the sides of the above described gate electrode, and also, activating impurities implanted into the substrate surface with the active regions on both the sides of the above described mask, coupling onto a side opposite to the above described gate electrode of the above described local shallow source/drain diffusing layer so as to form a deep source/drain diffusing layer having a junction depth deeper than the Junction depth of the above described local shallow source/drain diffusing layer.

A method of forming semiconductor devices, described in the second invention comprising a step of forming active regions by blocking the surface of the semiconductor substrate so as to form an approximately rectangular (sectional) gate electrode through a gate insulating film in approximate center of the above described active region, a step of forming a side wall insulating film on both the side faces of the above described gate electrode, a step of depositing the semiconductor film to approximately uniform thickness on the above described substrate, a step of effecting anisotropical etching operation with respect to the above described semiconductor film so as to make portions thinner, existing on the surface of the above described gate electrode and the substrate surface of the above described active region of the above described semiconductor, while leaving a portion thicker, in contact with the side face of the above described side wall insulation film of the above described semiconductor film, a step of oxidizing, nitriding the exposed faces of the above described semiconductor film so as to change a portion, existing the surface of the above described gate electrode and of the substrate surface of the above described active region of the above described semiconductor film, into protective insulating film, while leaving a portion, in contact with the side face of the above described side wall insulating film of the above described semiconductor film, into some thickness so as to make semiconductor side walls, a step of introducing conductive type impurities different from the conductive type of the substrate, within a mask in a region where the above described mask exists, with the gate electrode, the side wall insulating film and the semiconductor side wall as a masks, while implanting ions into the above described substrate, with accelerating energies reaching the substrate surface through the above described protective insulating film in the active regions on both sides of the above described masks, a step of effecting a thermal treating operation, diffusing impurities implanted into the above described semiconductor side wall onto the substrate surface through the opening portion, forming a local shallow source/drain diffusing layer on both the sides of the above described gate electrode, and also, activating impurities implanted into the substrate surface with the active regions on both the sides of the above described mask, coupling to a side opposite to the above described gate electrode of the above described local shallow source/drain diffusing layer so as to form a deep source/drain diffusing layer having a Junction depth deeper than the junction depth of the above described local shallow source/drain diffusing layer.

A method of forming semiconductor elements, described in the third invention comprising a step of forming active regions by blocking the surface of the semiconductor substrate so as to form an approximately rectangular (sectional) gate electrode through a gate insulating film in the approximate center of the above described active region, a step of forming a first side wall insulating film on both the side faces of the above described gate electrode, a step of depositing the semiconductor film to approximately uniform thickness on the above described substrate, a step of sequentially depositing insulating films having a property not oxidized or nitrized into approximately uniform thickness on the above described substrate, a step of effecting an anisotropical etching operation with respect to the above described insulating film so as to form a second side wall insulating film, made of the above described insulating films, for covering the side face of the above described gate electrode through the above described semiconductor film, a step of oxidizing, nitriding with the second side wall insulating film as a mask so as to change portions, existing the surface of the above described gate electrode and the substrate surface of the above described active region of the above described semiconductor film into the protective insulating film, while leaving a portion grasped between the side face of the above described first side wall insulating film of the above described semiconductor film and the above described second side wall insulating film, introducing conductive type impurities different from the conductive type of the above described substrate, within a mask in a region where the above described mask exists, with the above described gate electrode, the first side wall insulating film and the semiconductor side wall as masks, while implanting ions into the above described substrate, with accelerating energies reaching the substrate surface through the protective insulating film in both the active regions of the masks, a step of effecting a thermal treating operation, diffusing impurities implanted into the above described semiconductor side wall onto the substrate surface through the above described opening portion, forming a local shallow source/drain diffusing layer on both the sides of the above described gate electrode, and also, activating impurities implanted into the substrate surface with the active regions on both the sides of the above described mask, being coupled to a side opposite to the above described gate electrode of the above described local source/drain diffusing layer so as to form a deep source/drain diffusing layer having a junction depth deeper than the Junction depth of the above described local shallow source/drain diffusing layer.

A method of forming semiconductor devices, described in the fourth invention, comprising a step of forming active regions by blocking the surfaces of the semiconductor substrate so as to form an approximately rectangular (sectional) gate electrode through a gate insulating film in approximate center of the above described active region, a step of forming a side wall insulating film on both the side faces of the gate electrode, a step of depositing the semiconductor film into approximately uniform thickness on the above described substrate, a step of effecting an anisotropical etching operation with respect to the above described semiconductor film so as to make portions thin, existing on the surface of the above described gate electrode and the flat face of the above described active region of the above described semiconductor film, while leaving a portion thick, in contact with the side face of the above described side wall insulating film of the above described semiconductor film, a step of oxidizing or nitriding the exposed face of the above described semiconductor film so as to change portions, existing on the surface of the above described gate electrode and the flat face of the above described active region of the above described semiconductor, into an insulating film, while leaving a portion, in contact with the side face of the above described side wall insulating film of the above described semiconductor film, into some thickness for making semiconductor side walls, a step of removing the above described insulating film so as to expose the side face of the above described semiconductor side wall and the substrate surface of the above described active region, a step of depositing a high melting point metallic film on the above described substrate, a step of effecting a thermal treatment operation so as to form an alloy layer by reaction with the above described high melting point on the side face of the above described semiconductor side wall and the substrate surface of the above described active region, introducing conductive type impurities different from the conductive type of the substrate, within a mask in a region where the above described mask exists, with the above described gate electrode, the side wall insulating film and the semiconductor side wall as masks, while implanting ions into the above described substrate, with accelerating energies reaching the substrate surface, through the unreactive high melting point metallic film and the above described alloy layer in the active regions on both the sides of the above described mask, a step of removing the unreactive high melting point metallic film remained on the above described substrate, a step of effecting a thermal treating operation, diffusing impurities implanted into the above described semiconductor side wall onto the substrate surface through the above described opening portion, forming a local shallow source/drain diffusing layer on both the sides of the above described gate electrode, and also, activating impurities implanted into the substrate surface with the active regions on both the sides of the above described mask, being coupled to a side opposite to the above described gate electrode of the above described local shallow source/drain diffusing layer so as to form a deep source/drain diffusing layer having a Junction depth deeper than the junction depth of the above described local shallow source/drain diffusing layer.

The above described high melting point metallic layer means a metallic layer having a melting point higher than a melting point of silicon. For example, it is Ti.

A method of forming semiconductor devices, described in the fifth invention is characterized in a method of forming semiconductor devices described in any one of the first to fourth inventions, that a step of ion-implanting conductive type of impurities different from the conductive type of the above described substrate into the above described substrate includes a step of implanting with a given inclination angle from an oblique direction with respect to the above described substrate surface and a step of implanting it from approximately vertical direction with respect to the above described substrate surface.

A method of forming semiconductor devices, described in the sixth invention is characterized in a method of forming semiconductor devices described in any one of the first to fourth inventions, that a layer insulating film is formed on the surface of the above described gate electrode before a processing step of the gate electrode after building up layers of semiconductor films being materials of the gate electrode on the above described active region.

A method of forming semiconductor devices, described in the seventh invention is characterized in a method of forming semiconductor devices described in the fourth invention, that a silicide layer is adapted to be formed as the above described alloy layer with the above described semiconductor substrate and the above described gate electrode being respectively composed of silicons.

A method of forming semiconductor devices described in the eighth invention is characterized in a method of forming semiconductor devices described in the seventh invention, comprising a step of removing the high melting point metallic film of the above described unreaction, the thermal treatment for forming the above described alloy layer being a first rapid thermal treating operation, thereafter a step of effecting a second rapid thermal treating operation so as to stabilize the crystal structure of the above described silicide layer.

The above described rapid thermal treating operation is so-called rapid thermal annealing (RTA) and means that thermal treating operation is effected rapidly without the use of an electric furnace. For example, it means a thermal treating operation by a lamp heating operation.

A method of forming semiconductor devices described in the ninth invention is characterized in a method of forming semiconductor devices described in the fifth invention, that the above described semiconductor substrate is composed of a P type silicone, thickness in a direction parallel to the above described substrate surface of the described semiconductor side walls is made within the range of 1000 Å through 2000 Å, an ionic pieces of the impurities to be in planted when it is implanted into the above described semiconductor side wall from a direction oblique with respect to the above described substrate surface is made $^{31}P^+$, implanting conditions are set respectively within a range of acceleration energy 40 KeV through 150 KeV, inclination angle 30 degrees through 90 degrees, doze quantity $1 \times 10^{14}$ cm$^{-2}$ through $1 \times 10^{15}$ cm$^{-2}$.

A method of forming semiconductor devices described in the tenth invention, is characterized in a method of forming semiconductor devices described in the fifth invention that the above described semiconductor substrate is composed of a P type silicon, thickness in a direction parallel to the above described substrate surface of the above described semiconductor side walls is made within the range of 1000 Å through 2000 Å, an ionic pieces of the impurities to be planted when it is implanted into the above described semiconductor side wall from a direction oblique with respect to the above described substrate surface is made $^{75}As^+$, implanting conditions are set respectively within a range of acceleration energy 150 KeV through 300 KeV, inclination angle 30 degrees through 90 degrees, dose quantity $1 \times 10^{14}$ cm$^{-2}$ through $1 \times 10^{15}$ cm$^{-2}$.

A method of forming semiconductor devices described in the first to fourth inventions introduces impurities onto the substrate surface on both the sides of the gate electrode so as to form respectively a local shallow source, drain diffusing layer by the diffusion from the conductive side wall formed on the upper layer from the substrate surface, namely, from the locally elevated layer. Accordingly, the influences of the channeling is not given unlike a case where the impurities are introduced by the ion implanting operation. As the junction is formed by the diffusion from the upper layer from the substrate surface so that it is extremely effective in the shallow junction. The short channel effect (stipulated at the junction depth of approximately the channel neighborhood) is restrained by the shallow junction.

As the deep source/drain diffusion layer is formed by the implantation and diffusion onto the normal substrate surface, the shallow junction is not effected so that sheet resistance does not increases. As the semiconductor side wall function as one portion of the diffusion layer in the region where the semiconductor side wall exists, the resistance increase of the diffusing layer by the shallow junction is restrained.

As the impurities are not implanted directly into the substrate by the existence of the off set by the thickness of the semiconductor side wall in a region where the semiconductor side wall of the gate electrode is formed at the ion implanting operation, the defect generation of the channel neighborhood is restrained and the reverse short channel effect due to the defect caused is restrained. Carriers are accumulated on the field face on the gate electrode side of the semiconductor side wall by the gate electric field, thus resulting in mutual increased conductance. The electric current driving force reduction of the elements due to the shallow junction is restrained.

The process is similar to the normal insulated gate field effect transistor forming process before the gate electrode formation. As the semiconductor side wall covers the whole opening portion or an opening portion is not provided in a location of the semiconductor side wall, problems of etching damages or the like such as a case where the conventional recess method is used ((3) method) and a case of the locally elevated ((5) method) are not caused. As the local shallow source/drain diffusing layer and a deep source/drain diffusing layer are formed in self-aligned manner with the gate electrode independently of patterning using the photolithography. Unlike a case of the conventional recess method ((3) method) and a case of the pasting poly Si ((4) method), a problem of characteristic dispersion or the like due to the alignment shift and the enlargement of the area by the alignment margin is restricted. A MOSFET for simultaneously realizing the restraining of the short channel structure and the high electric current driving force can be formed by increase in the first photolithography as compared with the normal MOSFET process. The process can be simplified as compared with the case of the conventional locally elevated ((5) method).

In a method of forming semiconductor devices described in the fifth invention, a step of ion-implanting conductive type impurities different from the conductive type of the substrate into the above described substrate includes a step of implanting them with a given inclination angle from a direction oblique with respect to the substrate surface, and a step of implanting them from approximately vertical direction with respect to the substrate surface. The impurities are implanted effectively into the whole of the semiconductor side wall, especially a portion adjacent to the substrate surface, at a step of implanting at a given inclination angle, from an oblique direction with respect to the above described substrate surface. As a result, the semiconductor side wall becomes higher in impurity concentration to increase the current driving force of the device. At a step of implanting them from approximately vertical direction with respect to the above described substrate surface, the impurities are implanted effectively into the substrate surface of the active area on both the sides of the semiconductor side wall.

In a method of forming the semiconductor devices described in the sixth invention, a layer insulating film is formed on the surface of the above described gate electrode before a processing step of the gate electrode after building up layers of semiconductor films being materials of the gate electrode on the above described active region so that the gate electrode is protected by the above described layer insulating film in the next step and subsequent.

In a method of forming the semiconductor devices of the seventh invention, a silicide layer is formed as the above described alloy layer so that the sheet resistance of the semiconductor side wall and the deep source drain diffusing layer is reduced, thus making the performance of the device higher. The projection range at the implantation is reduced and the channeling is restrained by the existence of the silicide layer on the substrate surface at a step of implanting the impurities of a conductive type different from the conductive type of the substrate into the above described substrate. As a result, the deep source/drain diffusing layer is shallow to some extent and also, the short channel effect is restrained. At this time, the above described deep source/drain diffusing layer is silicidated on surface even if it is shallow to some extent, so that the deterioration of the devices performance is not caused by the increase in the sheet resistance and the increase in parasitic resistance. The semiconductor side wall adjacent to the gate electrode is silicidated so that the silicidated layer is approached so far as the gate electrode neighborhood so that the series resistance value can be reduced.

In the method of forming semiconductor devices described in the eighth invention, thermal treatment for forming the above described alloy layer is effected by the rapid thermal treatment so that the heating and cooling operations are comparatively rapidly effected, thus resulting in semi-stable condition in the crystal structure of the formed silicide layer. After a step of removing the above described unreaction high melting point metallic film, the rapid thermal treatment such as lamp heating or the like is effected again so as to stabilize the crystal construction of the above described silicided film. Therefore, the reliability of the device is improved.

A method of forming semiconductor devices described in the ninth invention is characterized that the above described semiconductor substrate is composed of a P type silicon, thickness in a direction parallel to the above described substrate surface of the above described semiconductor side wall is made within the range of 1000 Å through 2000 Å, an ionic species of the impurities to be implanted when it is implanted into the above described semiconductor side wall from a direction oblique with respect to the above described substrate surface is made $^{31}P^+$, implanting conditions are set respectively within a range of acceleration energy 40 KeV through 150 KeV, inclination angle 30 degrees through 90 degrees, dose quantity $1 \times 10^{14}$ cm$^{-2}$ through $1 \times 10^{15}$ cm$^{-2}$ so that superior local shallow source/drain diffusing layer being formed.

A method of forming semiconductor devices described in the tenth invention is characterized that the above described semiconductor substrate is composed of a P type silicon, thickness in a direction parallel to the above described substrate surface of the above described semiconductor side walls is made within the range of 1000 Å through 2000 Å, an ionic pieces of the impurities to be implanted when it is implanted into the above described semiconductor side wall from a direction oblique with respect to the above described substrate surface is made $^{75}As^+$, implanting conditions are set respectively within a range of acceleration energy 150 KeV through 300 KeV, inclination angle 30 degrees through 90 degrees, dose quantity $1 \times 10^{14}$ cm$^{-2}$ through $1 \times 10^{15}$ cm$^{-2}$ so that a superior source/drain diffusing layer is formed.

BRIEF DESCRIPTION OF THE DRAWINGS

These and other objects and features of the present invention will become apparent from the following description of the preferred embodiments thereof with reference to the accompanying drawings, in which;

FIGS. 2(a) to 2(e) are views showing a forming step of a semiconductor device in the first embodiment of the present invention;

FIGS. 4(a) to 4(h) are views showing a forming step of a semiconductor device in a third embodiment of the present invention;

FIGS. 6(a) to 6(h) are views showing a forming step of a semiconductor device in a fifth embodiment of the present invention;

DETAILED DESCRIPTION OF THE INVENTION

Figure 1:
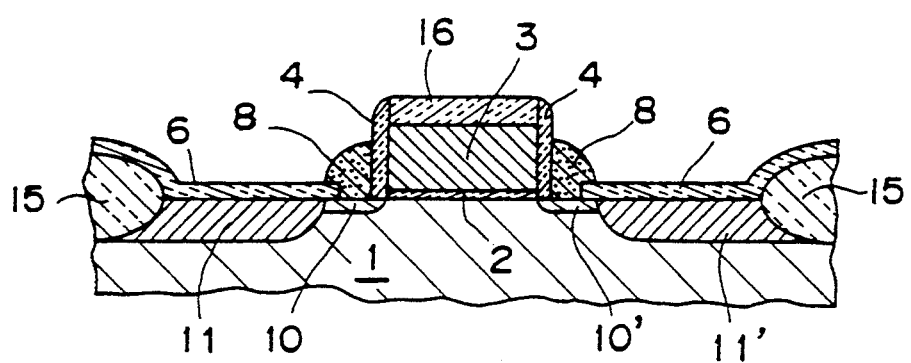
FIG. 1 is a view showing a cross sectional view showing a semiconductor device to be fabricated in a forming step in a first embodiment of the present invention.

Before the description of the present invention proceeds, it is to be noted that like parts are designated by like reference numerals throughout the accompanying drawings.

A method of forming semiconductor device of the present invention will be described hereinafter in detail with reference to embodiments.

FIG. 1 shows a sectional structure of an insulated gate field effect transistor to be fabricated by a forming method in a first embodiment of the present invention. In FIG. 1, the surface of a P type single crystal Si substrate 1 is blocked by an isolation region 15. A region surrounded by isolation regions 15, 15 becomes an active region. Reference numeral 2 is a gate insulating film, reference numeral 3 is a gate electrode, reference numeral 4 is a first side wall insulating film, reference numeral 6 is a protective insulating film, reference numeral 8 is a semiconductor side wall, reference numerals 10, 10' are local shallow source/drain diffusing layers, reference numerals 11, 11' are deep source/drain diffusing layers. The local shallow source/drain diffusing layers 10, 10' are provided on the surfaces of the active region on both sides of the gate electrode 3. The deep source/drain diffusing layers 11, 11' are coupled to the side opposite to the gate electrode 3 of the above described local shallow source/drain diffusing layers 10, 10' and have junction depth larger than the junction depth of the above described local shallow source/drain diffusing layers 10, 10'.

FIG. 2 shows a step of forming a N channel insulated gate field effect transistor as a first embodiment of the present invention. The present invention is applicable not only to the N channel, but also to even to a P channel. In accordance with FIG. 2, a step of forming the above described insulated gate field effect transistor.

As shown in FIG. 2(a), a step of forming a gate electrode 3 by a normal MOSFET process on a P type Si substrate 1. An isolation region 15 is provided by a local oxidation method on the surface of the Si substrate 1 so as to regulate the region between the isolation regions 15 as an active region. After the gate insulating film 2 is formed in the above described active region, an approximately sectional rectangular gate electrode 3 is formed by the photolithography and the etching with a layer insulation film 16, and a resist not shown as masks in the approximate center of the above described active region. The gate insulation film 2 is made the same in pattern as the gate electrode 3. The material quality of the layer insulating film 16 is made, for example, SiO$_2$. The layer insulating film 16 remains so that the gate electrode 3 can be protected in the next process and its subsequent.

Thereafter, insulating film of SiO$_2$ or the like is deposited within a range of 100 through 500 Å in thickness so as to form first side wall insulating films 4, 4 composed of SiO$_2$ on both the side faces of the gate electrode 3 by an etch-back.

Selective material quality, such as Si$_3$N$_4$ or the like is deposited within the range of 500 through 1500 Å in isotropic etching of wet etching or the like to the first side wall insulating film 4. Second side wall insulating films 5, 5 composed of Si$_3$N$_4$ or the like are formed on the exposed side face of the above described first side wall insulating films 4.

With the use of a deposition method inferior in step coverage property of sputter, atmospheric pressure CVD (chemical vapor phase deposition), ozone TEOS (tetra ethoxy silane), atmospheric pressure CVD or the like, a protective insulating film 6 composed of selective SiO$_2$ or the like in the etching with respect to second side wall insulating film 5 and semiconductor film 7 (FIG. 2(d)) is deposited. As shown in FIG. 2(a), the thickness of a portion for covering the side face of the step, namely, a portion for covering the side face of the second side wall insulating film 5 is thinner due to the deposition method. The thickness of the insulating film 6 is set within the range of 200 through 2000 Å on the flat face.

As shown in FIG.(b), an isotropic etching operation such as wet etching or the like with respect to the insulation film 6 is effected so as to expose the side face of the second side wall insulating film 5 so that portions existing onto the surface of the gate electrode 3 of the insulating film 6 and of the substrate surface may remain somewhat into some thickness. The etching operation can be effected, because the thickness of a portion for covering the side face of the second side wall insulation film 5 of the insulating film 6 becomes thinner than the thickness of a portion for covering the flat face due to the deposition method at a prior step.

As shown in FIG. 2(c), the second side wall insulating film 5 is removed by the etching of selective phosphate boil or the like with respect to the first side wall insulating film 4 and the insulating film 6 remaining on the flat portion so as to form opening portions δ, δ for exposing the substrate surface on both the sides of the first side wall insulating film 4. At this time, the substrate surface is adapted not to be etched through the opening portions δ, δ'.

As shown in FIG. 2(d), using a deposition method superior in the step coverage property of LPCVD or the like, the semiconductor film 7 is deposited with approximately uniform thickness and in a condition for burying the opening portions δ, δ. In the example, the material quality of the semiconductor film 7 is made a poly Si to be formed by a CVD method or single crystal Si to be formed by epitaxial growth. The thickness of the semiconductor film 7 is within the range of 700 through 2000 Å.

A semiconductor film 7 on the isolation region 15 is removed by the patterning using an etching operation of a photolithography, a RIE or the like. This ensure the insulating property of the source/drain for each device in the completed condition.

As shown in FIG. 2(e), an anisotropical etch back operation is effected by RIE or the like with respect to the semiconductor film 7 so as to form a semiconductor side wall 8, composed of semiconductor film 7, in contact with the first side wall insulating films 4, 4 and for covering the opening portions δ, δ. The semiconductor side wall 8 is formed for self-align operation with the gate electrode 3. Even if an over etch is effected, the semiconductor side wall 8 covers the opening portion δ. As the insulating film 6 has a selectivity with the semiconductor side wall 8 (semiconductor film 7) in etching operation, the etching operation is stopped by an insulting film 6 and the substrate surface in the active region is adapted not to be etched. The surface of the gate electrode 3 is protected by the layer insulating film 16. The vertical direction film thickness of the semiconductor side wall 8 is adjusted by the etching back quantity and is provided within the range of 1000 through 2000 Å

$^{75}As^+$ ion is implanted with conditions of 40 keV through 200 keV in acceleration energy, 5 through $50 \times 10^{14}$ cm$^{-2}$ in dose quantity with gate electrode 3, first side wall insulating films 4, 4 and semiconductor side walls 8, 8 as masks from approximately vertical direction with respect to the substrate surface. Source/drain diffusing layers 10, 10', 11, 11' are formed by the thermal treating operation. $^{75}As^+$ ion remains within the mask in the region where masks 3, 4, 4, 8, 8 exist in accordance with the set value of the acceleration energy, while $^{75}As^+$ reaches the substrate surface through the insulating film 6 in the active region on both the sides of the semiconductor side walls 8, 8.

A thermal treating operation is effected so as to diffuse $^{75}As^+$ implanted into the semiconductor side walls 8, 8 through opening portions δ, δ on the substrate surface so as to form the local shallow source/drain diffusion layer 10, 10' on both the sides of the gate electrode 3, and also, activate $^{75}As^+$ implanted onto the substrate surface on both sides of the semiconductor side walls 8, 8 so as to be coupled onto the side opposite to the gate electrode 3 of the local shallow source/drain diffusing layers 10, 10'. A deep source/drain diffusing layers 11, 11' having junction depth deeper than junction depth of the local shallow source/drain diffusing layers 10, 10' is formed.

As the impurities are introduced into the substrate surface by the diffusion from the layer (semiconductor side wall 8) upper than the substrate surface in a region where the semiconductor side wall 8 near the gate electrode 3 is formed so as to form the local shallow source/drain diffusing layers 10, 10', influences of the channeling are not given at the ion implanting operation time unlike a case where the diffusing layer is formed by the normal ion implanting operation. As the junction is formed by the diffusion from the upper layer of the substrate surface, an extremely shallow junction can be formed so that the short channel effect can be effectively restrained.

Impurities are implanted directly into the substrate through the insulating film 6 at the ion implanting time and are diffused by the thermal treatment in the active regions on both the sides of the semiconductor side walls 8, 8. Source/drain diffusing layers 11, 11' having junction depth deeper than the junction depth of the local shallow source/drain diffusing layers 10, 10' can be formed. The junction depth can be made larger in a region where relatively influences upon the short channel effect away from the channel (immediately under the gate electrode 3) are less. As a result, the sheet resistance can be made smaller so as to restrain the increase of parasitic resistance. As the semiconductor side walls 8, 8 function as one portion of the diffusing layers 10, 10' in a region where semiconductor side walls 8, 8 are formed, the resistance increase by the shallow junction can be restrained.

At the ion implanting time, in a region where the semiconductor side wall 8 close to the gate electrode 3 is formed, impurities are not implanted directly into the substrate by the existence of an off set by the thickness of the semiconductor side wall 8 so that the defects generation closer to the channel can be restrained and the reverse short channel effect due to the defects generation can be restrained. As carriers are accumulated on the interface on the gate electrode side of the semiconductor side wall by the gate field, trans-conductance can be increased. The current driving force reduction of the device due to the shallow junction can be restrained by these effects so that effect can be driven in high current.

The process is similar to the normal insulated gate field effect transistor forming process before the gate electrode formation. As the semiconductor side walls 8, 8 cover the opening portions δ, δ' completely, a problem of etching damages or the like such as a case where the conventional recess method is used ((3) method) and a case of the local deposition ((5) method) is not caused. As the local shallow source/drain diffusing layers 10, 10' and the deep source/drain diffusing layers 11, 11' are formed for self-align operation with the gate electrode 3 independently of patterning using the photolithography. Unlike a case of the conventional recess method ((3) method) and a case of the pasting poly Si ((4) method), a problem of characteristic dispersion or the like due to alignment shift and the enlargement of the area by the alignment margin are not caused.

A MOSFET for simultaneously realizing the restraint of the short channel effect and the high electric current driving force can be formed by increase in the first photolithography as compared with the normal MOSFET process. The step can be simplified as compared with the case of the conventional local deposition ((5) method).

In the above described ion implanting step, an ion implanting operation may be effected with large inclined angle (30 through 90 degrees) from the oblique direction with respect to the above described substrate surface in addition to the implanting operation from the approximately vertical direction with respect to the above described substrate surface. Acceleration energies of the ion implanting operation from the oblique direction are desired to be 40 through 150 keV in a case where the ion type of the impurities is $^{21}P^+$ and 150 key through 300 key in a case where the ion type of the impurities is $^{75}As^+$. $1 \times 10^{14}$ cm$^{-2}$ through $1 \times 10^{15}$ cm$^{-2}$ are desired in implanting quantity. The implanting operation is effected by an implanting system (step implanting) where a total implanting quantity is equally divided (4 through 8 divisions) and the substratum 1 is rotated by quantity where the circumference is divided by division the same as the above described division for each of one division quantity implanting operation. Or the implanting operation is effected by an implanting system (rotation implanting) while the substrate is rotated at a constant speed. The rotating speed is made approximately 2 rps. In such a case, impurities can be implanted effectively into the whole of the semiconductor side wall 8, especially into a portion adjacent to the gate electrode 3. As a result, the semiconductor side wall 8 can be made n type in high concentration and also, the n type of region of relatively high concentration can be formed even immediately under the semiconductor side wall 8. In the normal source drain formation, it is difficult to form a shallow junction by the channeling at the ion implanting operation and by the rapid diffusion by the implanting damage. As the n type region of the relatively high density is formed in the Si substrate i with thermal diffusion at the step, a shallow junction can be effectively effected. As the impurities are not directly implanted into the substrate by the existence of the off set by the thickness of the semiconductor side wall 8 in a range where the semiconductor side wall 8 close to the gate electrode 3 has been formed at the ion implanting time, the defects generation close to the channel can be restrained and the reverse short channel effect due to the defect generation can be restrained. The maximum inclined angle of the ion implanting operation may be restricted to approximately 60 degrees from the structure of the Faraday cup (for counting dose quantity) of the implanting apparatus. In this case, the implanting operation from the above described oblique direction is set to 60 degrees in maximum inclined angle. The ionic species may be made not only the above described $^{75}As^+$ and $^{31}P^+$, but also $^{122}SSb^+$.

FIG. 3 shows a forming steps of the N channel insulated gate field effect transistor as a second embodiment of the present invention. The present invention can be likewise applicable even to not only the N channel, but also to the P channel. The step of forming the above described insulated gate field effect transistor will be described hereinafter in accordance with FIG. 3.

Figure 3A:
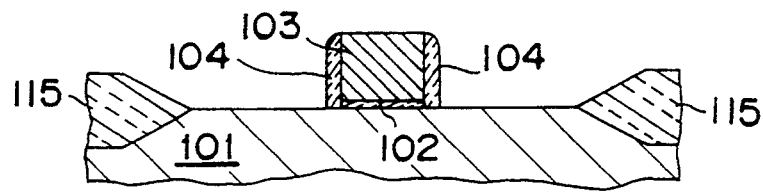
FIGS. 3(a) to 3(g) are views showing a forming step of a semiconductor device in a second embodiment of the present invention.

As shown in FIG. 3(a), a step to a gate electrode 103 formation is proceeded by the normal MOSFET process onto the P type Si substrate 101. Namely, an isolation region 115 is provided by a local oxidation method on the surface of the Si substrate 101 so as to regulate a region between the isolation regions 115 as an active region. After the gate insulating film 102 has been formed on the above described active region, an approximately rectangular (sectional) shaped gate electrode 103 (film thickness 1000 through 2000 Å) is formed by the photolithography and the etching operation with resist (not shown) as masks. The gate insulating film 102 is made the same in pattern as the gate electrode 103.

Thereafter, insulating films such as $SiO_2$, $Si_3N_4$ or the like are deposited by the CVD method and an etch back operation is effected by the anisotropical etching operation so as to form first side wall insulating films 104, 104 (300 through 1000 Å in thickness) composed of $SiO_2$, $Si_3N_4$ or the like.

Figure 3B:
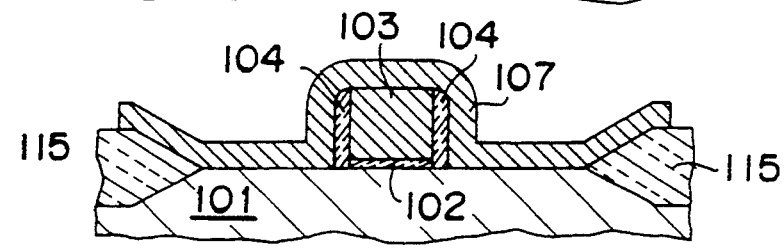

As shown in FIG. 3(b), the semiconductor film 107 is deposited to approximately uniform thickness with the use of an deposition method superior in the step coverage property of LPCVD or the like. In this embodiment, the material quality of the semiconductor film 107 is assumed to be poly Si to be formed by the CVD method, single crystal Si to be formed by epitaxial growth, or the like. Assume that the thickness of the semiconductor film 107 stays within the range of 500 through 2000 Å.

The semiconductor film 107 on the isolation region 115 is removed by the patterning using photolithography, and the etching of RIE or the like. This ensures the insulating property of the source/drain for each device in the completed condition.

Figure 3C:
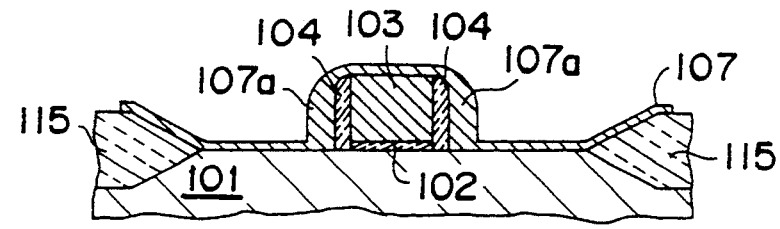

As shown in FIG. 3(c), an anisotropical etching operation is effected with respect to the semiconductor film 107 so as to make portions thin (approximately several 100 Å) existing on the surface of the gate electrode 103 and the substrate surface of the active region of the semiconductor film 107, while portions in contact with the side faces of the side wall insulating films 104, 104 of the semiconductor film 107 is left thick. In order to prevent the substrate surfaces from being damaged, the substrate surfaces of the active region are not exposed.

Figure 3D:
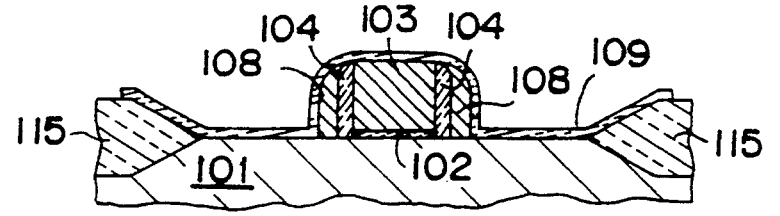

As shown in FIG. 3(d), the exposed face of the semiconductor film 107 is oxidized or nitrided by approximately several 100 Å so as to change portions existing on the surface of the gate electrode 103 of the semiconductor film 107 and on the substrate surface of the active region into insulation film 109, while portions in contact with the side faces of the side wall insulating films 104, 104 of the semiconductor 107 are left with some thickness into the semiconductor side wall 108. For later ion implanting process, the above described insulating film 109 is etched to have the film thickness into approximately 100 through 300 Å.

Figure 3E:
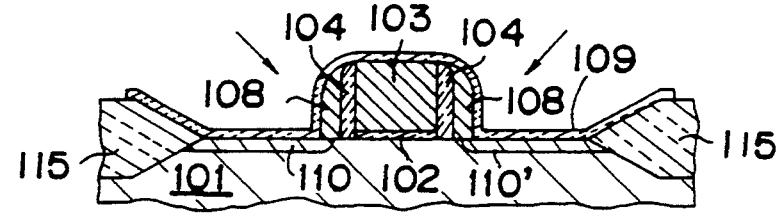

As shown in FIG. 3(e), the n type impurities are ion implanted with a large inclined angle (30 through 90 degrees) from the oblique direction with respect to the substrate surface with the gate electrode 103, the side wall insulating films 104, 104 and semiconductor side walls 108, 108 as masks. Acceleration energies of the ion implanting operation from the oblique direction are desired to be 60 through 150 keV in a case where the ion type of the impurities is $^{31}P^+$ and 150 keV through 300 key in a case where the ion type of the impurities is $^{75}As^+$. $1 \times 10^{14}$ cm$^{-2}$ through $1 \times 10^{15}$ cm$^{-2}$ are desired in implanting quantity. Impurity ions stay within the mask in a region where masks 103, 104, 104, 108, 108 exist in accordance with the set value of the acceleration energies, while the impurity ions reach the substrate surface through the insulating film 109 in the active region on both the sides of the semiconductor side walls 108, 108 (in the drawing, regions where the impurities are implanted at this time are shown with 110, 110′.) The implanting operation is effected by an implanting system (step implanting) where a total implanting quantity is equally divided (4 through 8 divisions) and the substratum 101 is rotated by quantity where the circumference is divided by division the same as the above described division for each of one division quantity implanting operation. Or the implanting operation is effected by an implanting system (rotation implanting), while the substrate is rotated at a constant speed. The rotating speed is approximately 2 rps. In such a case, impurities can be implanted effectively into the whole of the semiconductor side wall 108, especially into a portion adjacent to the substrate surface. As a result, the semiconductor side wall 8 can be made n type in high concentration and also, the n type of region of relatively high concentration can be formed even immediately under the semiconductor side wall 8. In the normal source/drain formation, it is difficult to form a shallow junction by the channeling at the ion implanting operation and by the rapid diffusion by the implanting damage. As the n type region of the relatively high density is formed in the Si substrate 101 with thermal diffusion at the step, a shallow junction can be effectively effected. As the impurities are not directly implanted into the substrate by the existence of the off set by the thickness of the semiconductor side wall 108 in a range where the semiconductor side wall 108 close to the gate electrode 3 has been formed at the ion implanting time, the defects generation close to the channel can be restrained and the reverse short channel effect due to the defects generation can be restrained. The maximum inclined angle of the ion implanting operation may be restricted to approximately 60 degrees from the structure of the Faraday cup of the implanting apparatus. In this case, the implanting operation from the above described oblique direction is set to 60 degrees in maximum inclined angle. The ion type may be made not only the above described $^{75}As^+$ and $-P^+$, but also $^{122}Sb^+$.

Figure 3F:
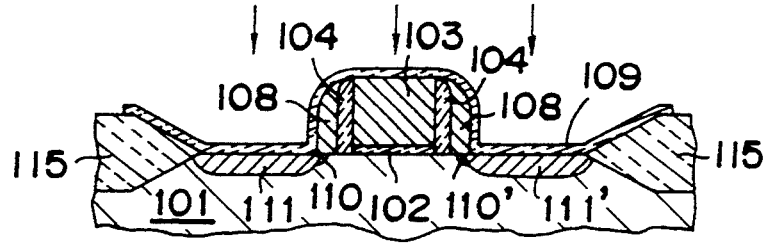

As shown in FIG. 3(f), $^{75}As^+$ is ion implanted from an approximately vertical direction with respect to the above described substrate surface with the gate electrode 103, the side wall insulating film 104, 104 and semiconductor side walls 108, 108 as masks. Acceleration energies are assumed to be approximately 40 through 60 keV. Impurity ions stay within the mask in a region where masks 103, 104, 104, 108, 108 exist in accordance with the set value of the acceleration energies as in the implanting case from the oblique direction, while the impurity ions reach the substrate surface through the insulating film 109 in the active region on both the sides of the semiconductor side walls 108, 108 (in the drawing, regions where the impurities are implanted at this time are shown with 111, 111′.) The ion type may be provided not only the above described $^{75}As^+$, but also $^{31}P^+$, and $^{122}Sb^+$. Also, the implanting step from the vertical direction may be effected before the implanting step from the oblique direction.

Figure 3G:
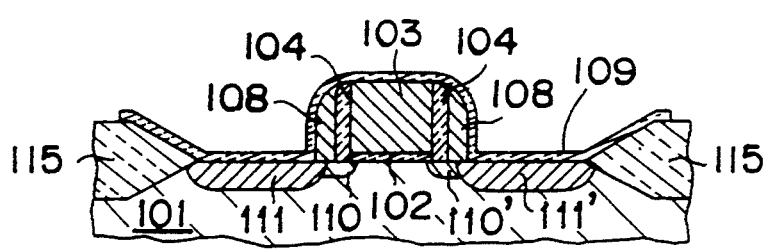

Finally, as shown in FIG. 3(g), a thermal treating operation is effected so as to diffuse $^{75}As^+$ or the like implanted into 108, 108 into the semiconductor side wall so as to form the local shallow source/drain diffusion layers 110, 110′ on both the sides of the gate electrode 103, and also, $^{75}As^+$ implanted onto the substrate surface on both sides of the semiconductor side walls 108, 108 is activated so as to be coupled onto the side opposite to the gate electrode 103 of the local shallow source/drain diffusing layers 110, 110′. Deep source/drain diffusing layers 111, 111′ having junction depth deeper than the junction depth of the local shallow splicing source/drain diffusing layers 110, 110′ are formed.

The impurities are introduced onto the substrate surface by the diffusion from the layer (semiconductor side wall 108) upper than the substrate surface in a region where the semiconductor side wall 108 near the gate electrode 103 is formed so as to form the local shallow source/drain diffusing layers 110, 110′, influences of the channeling are not given at the ion implanting operation unlike a case where the diffusing layer is formed by the normal ion implanting operation. As the junction is formed by the diffusion from the upper layer of the substrate surface, an extreme shallow junction can be formed so that the short channel effect can be effectively restrained.

Impurities are implanted directly into the substrate through the insulating film 109 at the ion implanting time and are diffused by the thermal treatment in the active regions on both the sides of the semiconductor side walls 108, 108. The source/drain diffusing layers 111, 111′ having a junction depth deeper than the junction depth of the local shallow source/drain diffusing layers 110, 110′ can be formed. The junction depth can be made larger in a region where influences upon the short channel effect away from the channel (immediately under the gate electrode 103.) are less. As a result, the sheet resistance can be made smaller so as to restrain the increase of the parasitic resistance. As the semiconductor side walls 108, 108 function as one portion of the diffusing layers 110, 110′ in a region where semiconductor side walls 108, 108 are formed, the resistance increases by the shallow junction can be restrained.

At the ion implanting time, in a region where the semiconductor side wall 108 close to the gate electrode 103 is formed, impurities are not implanted directly onto the substrate by the existence of an off set by the thickness of the semiconductor side wall 108 so that the defect generation closer to the channel can be restrained and the reverse short channel effect due to the defects generation can be restrained. As carriers are accumulated on the field face on the gate electrode side of the semiconductor side wall by the gate field, transconductance can be increased. The current driving force reduction of the device due to the shallow junction can be restrained by these effects so that device can be driven in high current.

The process is similar to the normal insulted gate field effect transistor forming process before the gate electrode formation. As an opening portion is not provided in a location of the semiconductor side wall 108, a problem of etching damages or the like such as a case where the conventional recess method is used ((3) method) and a case of the local deposition ((5) method). As the local shallow source/drain diffusing layers 110, 110′ and deep source/drain diffusing layers 111, 111′ are formed for self-align operation with the gate electrode 103 independently of patterning using the photolithography. Unlike a case of the conventional recess method ((3) method) and a case of the pasting poly Si ((4) method), a problem of characteristic dispersion or the like due to the alignment shift and enlargement of the area by the alignment margin are restricted.

A MOSFET for simultaneously realizing the high electric current driving force and the restraint of the short channel effect can be formed by increase in the first photolithography as compared with the normal MOSFET process. The step can be simplified as compared with the case of the conventional local deposition ((5) method).

FIG. 4 shows a forming step of the N channel insulated gate field effect transistor as a third embodiment of the present invention. The present invention can be likewise applicable even to not only the N channel, but also even to the P channel. The step of forming the insulated gate field effect transistor will be described hereinafter in accordance with FIG. 4.

As shown in FIG. 4(a), a step to a gate electrode 203 formation is proceeded by the normal MOSFET process onto the P type Si substrate 201. Namely, an isolation region 215 is provided by a local oxidation method on the surface of the Si substrate 201 so as to regulate a region between the isolation regions 215 as an active region. After the gate insulating film 202 has been formed on the above described active region, an approximately rectangular (sectional) shaped gate electrode 203 (film thickness 1000 through 2000Å) is formed, by the photolithography and the etching operation, in the approximate center of the above described active region. The gate insulating film 202 is made the same in pattern as the gate electrode 203.

Thereafter, insulating films such as $SiO_2$, $Si_3N_4$ or the like are deposited by the CVD method and an etch back operation is effected by the anisotropical etching operation so as to form first side wall insulating films 204, 204 (300 through 1000 Å in thickness) composed of $SiO_2$, $Si_3N_4$ or the like.

As shown in FIG. 4(b), the semiconductor film 107 is deposited to approximately uniform thickness with the use of a deposition method superior in the step coverage property of LPCVD or the like. In this embodiment, the material quality of the semiconductor film 207 is assumed to be poly Si to be formed by the CVD method, single crystal Si to be formed by epitaxial growth, or the like. Assume that the thickness of the semiconductor film 207 is within the range of 500 through 2000 Å.

The semiconductor film 207 on the isolation region 215 is removed by the patterning using photolithography and the etching of RIE or the like. This ensures the insulating property of the source/drain for each device in the completed condition.

As shown in FIG. 4(c), an insulating film 205 having a nature not oxidized of $Si_3N_4$ or the like is deposited into approximately equal thickness (500 through 1000 Å) with the use of a deposition method superior in the step coverage property of LPCVD or the like.

As shown in FIG. 4(d), the anisotropical etching operation is effected with respect to the insulating film 205 is effected so as to form the second side wall insulating film 205 for covering the side face of the gate electrode 203 through the semiconductor film 207.

As shown in FIG. 4(e), the semiconductor film 207, for example, is oxidized with the second side wall insulating film 205 as a mask so as to change portions existing on the surface of the gate electrode 203 of the semiconductor film 207 and on the substrate surface of the active region into the protective insulating film 206 composed of $SiO_2$, while portions 207a grasped by the first side wall insulating film 204 of the semiconductor film 207 and the second side wall insulating film 205 are left and are provided as a semiconductor side wall 208. For later ion implanting step, the second side wall insulating film 205 is removed and the above described insulating film 206 is etched to have the film thickness into approximately 100 Å through 300 Å.

As shown in FIG. 4(f), the n type impurities are ion implanted with large inclined angle (30 through 90 degrees) from the oblique direction with respect to the substrate surface with the gate electrode 203, the side wall insulating film 204, 204 and semiconductor side walls 208, 208 as masks. Acceleration energies of the ion implanting operation from the oblique direction are desired to be 60 through 150 keV in a case where the ion type of the impurities is $^{31}P+$ and 150 keV through 300 key in a case where the ion type of the impurities is $^{75}As+$. $1 \times 10^{14}$ cm$^{-2}$ through $1 \times 10^{15}$ cm$^{-2}$ are desired in implanting quantity. Impurity ions stay within the mask in a region where masks 203, 204, 204, 208, 208 exist in accordance with the set value of the acceleration energies, while the impurities ions reach the substrate surface through the insulating film 206 in the active region on both the sides of the semiconductor side walls 208, 208 (in the drawing, regions where the impurities are implanted at this time are shown with 210, 210') The implanting operation is effected by an implanting system (step implanting) where a total implanting quantity is equally divided (4 through 8 divisions) and the substratum 201 is rotated by quantity where the circumference is divided by division the same as the above described division for each of one division quantity implanting operation. Or the implanting operation is effected by an implanting system (rotation implanting) while the substrate is being rotated at a constant speed. The rotating speed is made approximately 2 rps. In such a case, impurities can be implanted effectively into the whole of the semiconductor side wall 208, especially into a portion adjacent to the substrate surface. As a result, The semiconductor side wall 208 can be made n type in high concentration and also, the n type of region of relatively high concentration can be formed even immediately under the semiconductor side wall 208. In the normal source/drain formation, it is difficult to form a shallow junction by the channeling at the ion implanting operation and by the rapid diffusion by the implanting damages in the normal source/drain formation. As the n type region of the relatively high concentration is formed in the Si substrate 201 with thermal diffusion at the step, a shallow junction can be effectively formed. As the impurities are not directly implanted into the substrate by the existence of the off set by the thickness of the semiconductor side wall 208 in a range where the semiconductor side wall 208 close to the gate electrode 203 has been formed at the ion implanting time, the defects generation close to the channel can be restrained and the reverse short channel effect due to the defect generation can be restrained. The maximum inclined angle of the ion implanting operation may be restricted to approximately 60 degrees from the structure of the Faraday cup of the implanting apparatus. In this case, the implanting operation from the above described oblique direction is set to 60 degrees in maximum inclined angle. The ion type may be made not only the above described $^{75}As+$ and $^{31}P+$, but also $^{122}Sb+$.

As shown in FIG. 4(g), $^{75}As+$ is ion implanted from approximately vertical direction with respect to the substrate surface with the gate electrode 203, the side wall insulating film 204, 204 and semiconductor side walls 208, 208 as masks. Acceleration energies are assumed to be approximately 40 through 60 keV. Impurity ions stay within the mask in a region where masks 203, 204, 204, 208, 208 exist in accordance with the set value of the acceleration energies as in the implanting case from the oblique direction, while the impurity ions reach the substrate surface through the insulating film 206 in the active region on both the sides of the semiconductor side walls 208, 208 (in the drawing, regions where the impurities are implanted at this time are shown with 211, 211'.) The ion type may be made not only the above described $^{75}$As+ and $^{31}$P+, but also $^{122}$Sb+. Also, the implanting step from the vertical direction may be effected before the implanting step from the oblique direction.

As shown in FIG. 4(h), a thermal treating operation is effected so as to diffuse $^{75}$As+ or the like implanted into 208, 208 onto the semiconductor side walls 208, 208 so as to form the local shallow source/drain diffusion layers 210, 210' on semiconductor substrate 201, and also, $^{75}$As implanted onto the substrate surface on both the sides of the semiconductor side walls 208, 208 is activated so as to be coupled onto the side opposite to the gate electrode 203 of the local shallow source/drain diffusing layers 210, 210'. Deep source/drain diffusing layers 211, 211' having junction depth deeper than the junction depth of the local shallow source/drain diffusing layers 210, 210' are formed.

The impurities are introduced into the substrate surface by the diffusion from the layer (semiconductor side wall 208) upper than the substrate surface in a region where the semiconductor side wall 208 near the gate electrode 203 is formed so as to form the local shallow source/drain diffusing layers 210, 210', influences of the channeling are not given at the ion implanting operation unlike a case where the diffusing layer is formed by the normal ion implanting operation. As the junction is formed by the diffusion from the upper layer of the substrate surface, an extreme shallow junction can be formed so that the short channel effect can be effectively restrained.

Impurities are implanted directly into the substrate through the insulating film 206 at the ion implanting time and are diffused by the thermal treatment in the active regions on both the sides of the semiconductor side walls 208, 208. The source/drain diffusing layers 211, 211' having a junction depth deeper than the junction depth of the local shallow source/drain diffusing layers 210, 210' can be formed. A junction depth can be made larger in a region where influences are relatively less upon the short channel effect away from the channel (immediately under the gate electrode 203). As a result, the sheet resistance can be made smaller so as to restrain the increase of parasitic resistance. As the semiconductor side walls 208, 208 function as one portion of the diffusing layers 210, 210' in a region where semiconductor side walls 208, 208 are formed, the resistance increase by the shallow junction can be restrained.

At the ion implanting time, in a region where the semiconductor side wall 208 close to the gate electrode 203 is formed, impurities are not implanted directly into the substrate plate by the existence of an off set by the thickness of the semiconductor side wall 208 so that the defect generation closer to the channel can be restrained and the reverse short channel effect due to the defects generation can be restrained. As carriers are accumulated on the interface on the gate electrode side of the semiconductor side wall by the gate field, transconductance can be increased. The current driving force reduction of the device due to the shallow junction can be restrained by these effects so that the device can be driven in high current.

The process is similar to the normal insulated gate type field effect transistor forming process before the gate electrode formation. As the opening portion is not provided in a location of the semiconductor side wall 208, a problem of etching damages or the like such as a case where the conventional recess method is used ((3) method) and a case of the local deposition ((5) method) is not caused. As the local shallow source/drain diffusing layers 210, 210' and deep source/drain diffusing layers 211, 211' are formed for self-align operation with the gate electrode 203 independently of patterning using the photolithography. Unlike a case of the conventional recess method ((3) method) and a case of the pasting poly Si ((4) method), a problem of characteristic dispersion or the like due to the alignment shifts and the enlargement of the area by the alignment margin are restricted.

A MOSFET for simultaneously realizing the restraint of the short channel effect and the high electric current driving force can be formed by increase in the first photolithography as compared with the normal MOSFET process. The step can be simplified as compared with the case of the conventional local deposition ((5) method).

Figure 5:
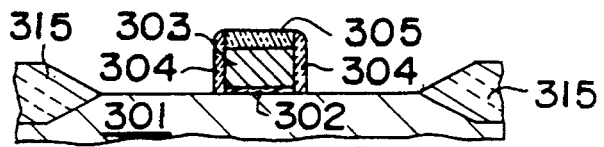
FIGS. 5(a) to 5(j) are views showing a forming step of a semiconductor device in a fourth embodiment of the present invention.
Figure 5:
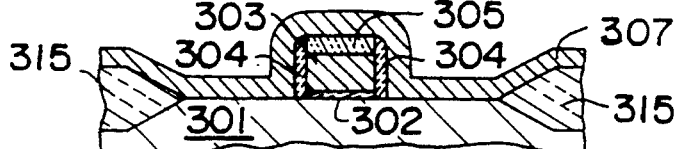
Figure 5:
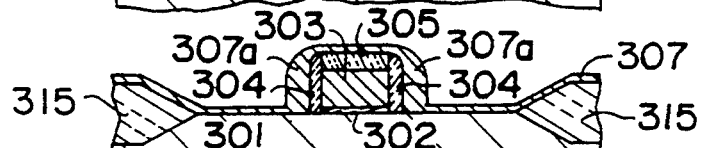
Figure 5:
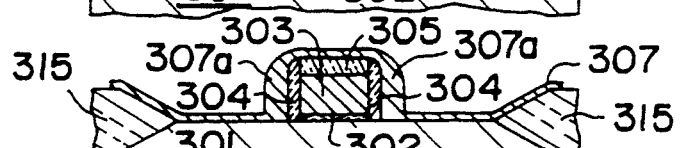
Figure 5:
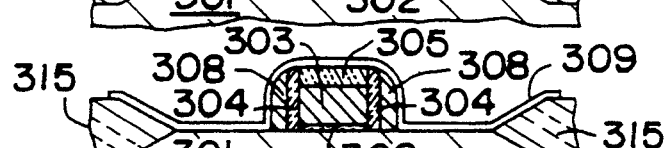
Figure 5:
Figure 5:
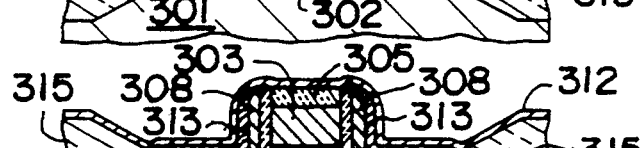
Figure 5:
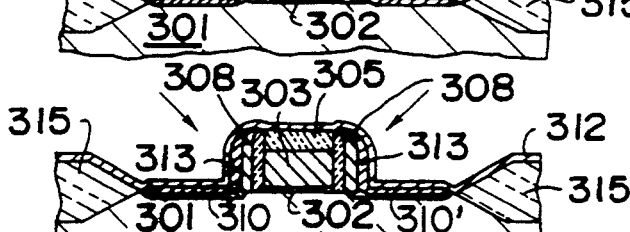
Figure 5:
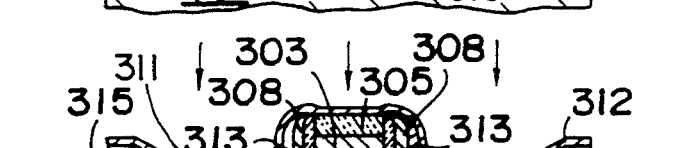
Figure 5:
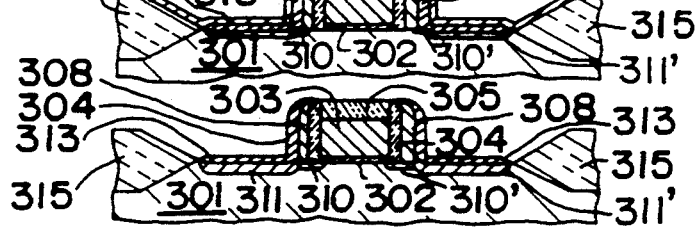

FIG. 5 shows a forming step of the N channel insulating gate type field effect transistor as a fourth embodiment of the present invention. The present invention can be likewise applicable even to not only the N channel, but also to the P channel. The step of forming the above described insulated gate field effect transistor will be described hereinafter in accordance with FIG. 5.

As shown in FIG. 5(a), a step to a gate electrode 303 formation is proceeded by the normal MOSFET process onto the P type Si substrate 301. Namely, an isolation region 315 is provided by a local oxidation method on the surface of the Si substrate 301 so as to regulate a region between the isolation regions 315 as an active region. After the gate insulating film 302 has been formed on the above described active region, an approximately rectangular (sectional) shaped gate electrode 303 (film thickness 1000 through 2000 Å) is formed by the photolithography and the etching operation with insulating film 305 and resist not shown as masks. The material quality of the layer insulating film 305 is assumed to be, for example, SiO$_2$. The gate electrode 303 can be protected in the next step and its subsequent with the later by insulating film 305 being left.

Thereafter, insulating films such as SiO$_2$, Si$_3$N$_4$ or the like are deposited and an etch back operation is effected so as to form first side wall insulating films 304, 304 (300 through 1000 Å in thickness) composed of SiO$_2$, Si$_3$N$_4$ or the like on both the side faces of the gate electrode 303.

As shown in FIG. 5(b), the semiconductor film 307 is deposited to approximately uniform thickness with the use of an deposition method superior in the step coverage property of LPCVD or the like. In this embodiment, the material quality of the semiconductor film 307 is assumed to be poly Si to be formed by the CVD method, single crystal Si to be formed by epitaxial growth. Assume that the thickness of the semiconductor film 307 stays within the range of 500 through 2000 Å.

As shown in FIG. 5(c), the anisotropical etching operation is effected with respect to the semiconductor film 307 so as to make portions thin (approximately several 100 Å) existing on the surface of the gate electrode 303 of the semiconductor film 307 and on the substrate surface of the active region, while a portion in contact with the side faces of the side wall insulating films 304, 304 of the semiconductor film 307 is left thick. The substrate surface of the active region is not exposed, because the damages are not given onto the substrate surface.

The semiconductor film 307 on the isolation region 315 is removed by the patterning using photolithography, and the etching of RIE or the like. This ensures the insulating property of the source/drain for each device in the completed condition.

As shown in FIG. 5(e), the exposed face of the semiconductor film 307 is oxidized or nitrided by approximately several 100 Å so as to completely change into protective insulating film 309 portions on the surface of the gate electrode 303 of the semiconductor film 307 and on the substrate surface of the active region, while portions 307a in contact with the side faces of the side wall insulating films 304, 304 of the semiconductor film 307 is left with some thickness and is made a semiconductor side wall 308.

As shown in FIG. 5(f), an insulating film 309 formed by oxidation or nitration is removed by an isotropic etching operation such as wet etching or the like so as to expose the side faces of the semiconductor side walls 308, 308 and the substrate surface of the active region, and continuously to deposite the high melting point metallic film 312 of Ti or the like within the range of 200 through 1000 Å in thickness.

As shown in FIG. 5(g), a lamp heating operation of 15 through 30 seconds under nitrogen atmosphere at 575° C. through 625° C. in temperature is effected as first rapid thermal annealing (RTA) and silicide layer 313 is formed as an alloy layer with respect to the high melting point metallic film 312 on the side face of the semiconductor side wall 308 composed of poly Si and on the substrate surface of the active region. The crystal structure of the silicide layer 313 becomes semi-stable due to RTA in thermal treatment.

As shown in FIG. 3(h), the n type impurities are ion implanted with an large inclined angle (30 through 90 degrees) from the oblique direction with respect to the above described substrate surface with the gate electrode 303, the side wall insulating films 304, 304 and semiconductor side walls 308, 308 as masks. Acceleration energies of the ion implanting operation from the oblique direction are desired to be 40 through 200 keV where a case of the ion type of the impurities is $^{31}P+$ and 150 keV through 400 keV in a case where the ion type of the impurities is $^{75}As+$. $1 \times 10^{14}$ cm$^{-2}$ through $1 \times 10^{15}$ cm$^{-2}$ are desired in implanting quantity. Impurity ions stay within the mask in a region where masks 303, 304, 304, 308, 308 exist in accordance with the set value of the acceleration energies, while the impurity ions reach the substrate surface through the unreactive high melting point metallic films 312 and the silicide layer 313 in the active region on both the sides of the semiconductor side walls 308, 308 (in the drawing, regions where the impurities are implanted at this time are shown with 310, 310'.) The implanting operation is effected by an implanting system (step implanting) where a total implanting quantity is equally divided (4 through 8 divisions) and the substrate 301 is rotated by quantity where the circumference is divided by division the same as the above described division for each of one division quantity implanting operation. Or the implanting operation is effected by an implanting system (rotation implanting) while the substrate is being rotated at a constant speed. The rotating speed is made approximately 2 rps. In such a case, impurities can be implanted effectively into the whole of the semiconductor side wall 308, especially into a portion adjacent to the substrate surface. As a result, the semiconductor side wall 308 can be made n type in high concentration and also, the n type of region in relatively high concentration can be formed even immediately under the semiconductor side wall 308. In the normal source/drain formation, it is difficult to form a shallow junction by the channeling at the ion implanting operation and by the rapid diffusion by the implanting damages. As the n type region of the relatively high density is formed in the Si substrate 301 with thermal diffusion at the step, a shallow junction can be effectively formed. As the impurities are not directly implanted into the substrate by the existence of the off set by the thickness of the semiconductor side wall 308 in a range where the semiconductor side wall 308 close to the gate electrode 303 has been formed at the ion implanting time, the defects generation close to the channel can be restrained and the reverse short channel effect due to the defect generation can be restrained. The maximum inclined angle of the ion implanting operation may be restricted to approximately 60 degree from the structure of the Faraday cup of the implanting apparatus. In this case, the implanting operation from the above described oblique direction is set to 60 degrees in maximum inclined angle. The ion type may be made not only the above described $^{75}As+$ and $^{31}P+$, but also $^{122}Sb+$.

As shown in FIG. 3(f), $^{75}As+$ is ion implanted from the approximately vertical direction with respect to the substrate surface with the gate electrode 303, the side wall insulating films 304, 304 and semiconductor side walls 308, 308 as masks. Acceleration energies are assumed to be approximately 50 through 200 keV. Impurity ions stay within the mask in a region where masks 303, 304, 304, 308, 308 exist in accordance with the set value of the acceleration energies as in the implanting case from the oblique direction, while the impurity ions reach the substrate surface through the unreactive high melting point metallic film 312 and the silicide layer 313 in the active region on both the sides of the semiconductor side walls 308, 308 (in the drawing, regions where the impurities are implanted at this time are shown with 311, 311'.) The ion type may be made not only the above described $^{75}As+$ and $^{31}P+$, but also $^{122}Sb+$. Also, the implanting step from the vertical direction may be effected before the implanting step from the oblique direction.

As shown in FIG. 5(j), a wet etching operation or the like such as sulfuric acid boil or the like is effected so as to remove the unreactive high melting point metallic film 312 remaining on the substrate 301, on gate electrode 305 and isolation region 315.

Finally, a lamp heating operation of 800° C. through 900° C. in temperature, 15 seconds through 30 seconds in time or 1000° C. through 1050° C. in temperature, 10 seconds through 20 seconds in time is effected under nitrogen atmosphere as a second rapid thermal treatment (RTA) so as to change silicide layer 313 into stable crystal structure. A further thermal treatment is effected when the conditions of RTA are made 800° C. through 900° C. in temperature, 15 seconds through 30 seconds in time. A thermal treating operation is effected so as to diffuse $^{75}As+$ or the like implanted into the semiconductor side walls 308, 308 so as to form the local shallow source/drain diffusion layer 310, 310' on both the sides of the gate electrode 303, and also, $^{75}$As+ implanted onto the substrate surface on both sides of the semiconductor side walls 308, 308 is activated so as to be coupled onto the side opposite to the gate electrode 3 of the local shallow source/drain diffusing layers 310, 310'. Deep source/drain diffusing layers 311, 311' having a junction depth larger than the junction depth of the local shallow source/drain diffusing layers 310, 310' is formed.

As the impurities are introduced into the substrate surface by the diffusion from the layer (semiconductor side wall 308) upper than the substrate surface in a region where the semiconductor side wall 308 near the gate electrode 303 is formed so as to form the local shallow source/drain diffusing layers 310, 310', influences of the channeling are not given at the ion implanting operation unlike a case where the diffusing layer is formed by the normal ion implanting operation. As the junction is formed by the diffusion from the upper layer of the substrate surface, an extreme shallow junction can be formed so that the short channel effect can be effectively restrained.

Impurities are implanted directly into the substrate through the unreactive high melting point metallic film 312 and the silicide layer 313 at the ion implanting time and are diffused by the thermal treatment in the active regions on both the sides of the semiconductor side walls 308, 308. The source/drain diffusing layers 311, 311' having a junction depth larger than the junction depth of the local shallow source/drain diffusing layers 310, 310' can be formed. The junction depth can be made larger in a region where influences are relatively less upon the short channel effect away from the channel (immediately under the gate electrode 303). As a result, the sheet resistance can be made smaller so as to restrain the increase of parasitic resistance. As the semiconductor side walls 308, 308 function as one portion of the diffusing layers 310, 310' in a region where semiconductor side walls 308, 308 are formed, the resistance increase by the shallow junction can be restrained.

At the ion implanting time, in a region where the semiconductor side wall 308 close to the gate electrode 303 is formed, impurities are not implanted directly into the substrate plate by the existence of an off set by the thickness of the semiconductor side wall 308 so that the defect generation closer to the channel can be restrained and the reverse short channel effect due to the defects generation can be restrained. As carriers are accumulated on the interface on the gate electrode side of the semiconductor side wall by the gate field, transconductance can be increased. The current driving force reduction of the device due to the shallow junction can be restrained by these effects so that device can be driven in high current.

The sheet resistance of the semiconductor side walls and the deep source/drain diffusing layers 311, 311' can be reduced by the existence of the silicide layer 313 and further the devices can be made higher in performance. The projection range at the implanting time is reduced and the channeling is restrained by the existence of the silicide layer 313 on the substrate surface at the above described ion implanting step. As a result, the deep splicing source/drain diffusing layers 311, 311' can be shallow-junction to some extent and the short channel effect can be restrained. At this time, the deep source/drain diffusing layers 311, 311' are silicidated on the surface even if they are shallow junction to some extent so that the deterioration of the device performance by increase in the sheet resistance and increase in parasitic resistance are restricted. The semiconductor side walls 308, 308 close to the gate electrode 303 are silicidated so that the silicide layer 313 can be made adjacent to the gate electrode 303 neighborhood so that the series resistance value can be reduced.

The process is similar to the normal insulating gate type electric field effect transistor forming process before the gate electrode formation. As an opening portion is not provided in a location of the semiconductor side wall 308, a problem of etching damages or the like such as a case where the conventional recess method is used ((3) method) and a case of the local deposition ((5) method) is not caused. As the local shallow source/drain diffusing layers 310, 310' and deep source/drain diffusing layers 311, 311' are formed for self-align operation with the gate electrode 303 independently of patterning using the photolithography. Unlike a case of the conventional recess method ((3) method) and a case of the pasting poly Si ((4) method), a problem of characteristic dispersion or the like due to the alignment shifts and the enlargement of the area by the alignment margin is not caused.

A MOSFET for simultaneously realizing the restraint of the short channel effect and the high electric current driving force can be formed by increase in the first photolithography as compared with the normal MOSFET process. The step can be simplified as compared with the case of the conventional local deposition ((5) method).

FIG. 6 shows a forming step of the N channel insulated gate field effect transistor as a fifth embodiment of the present invention. The present invention can be likewise applicable even to not only the N channel, but also to the P channel. The step of forming the above described insulated gate field effect transistor will be described hereinafter in accordance with FIG. 6.

As shown in FIG. 6(a), a step to a gate electrode 403 formation is proceeded by the normal MOSFET process onto the P type Si substrate 401. Namely, an isolation region 415 is provided by a local oxidation method on the surface of the Si substrate 401 so as to regulate a region between the isolation regions 415 as an active region. After the gate insulating film 402 has been formed on the above described active region, an approximately rectangular (sectional) shaped gate electrode 403 (film thickness 1000 through 2000 Å) is formed by the photolithography and the etching operation with resist not shown as masks. The gate insulating film 402 is made the same in pattern as the gate electrode 403. The material quality of the layer insulating film 405 is assumed to be, for example, SiO$_2$. The gate electrode 403 can be protected in the next process and its subsequent with the layer insulating film 405 being made left.

Thereafter, insulating films such as SiO$_2$, Si$_3$N$_4$ or the like are deposited by the CVD method and an etch back operation is effected by the anisotropical etching operation so as to form first side wall insulating films 404, 404 (300 through 1000 Å in thickness) composed of SiO$_2$, Si$_3$N$_4$ or the like on both the side faces of the gate electrode 403.

As shown in FIG. 6(b), the semiconductor film 407 is deposited to approximately uniform thickness with the use of a deposition method superior in the step coverage property of LPCVD or the like. In this embodiment, the material quality of the semiconductor film 407 is assumed to be poly Si to be formed by the CVD method, single crystal Si to be formed by epitaxial growth, or the like. Assume that the thickness of the semiconductor film 407 stays within the range of 500 through 2000 Å.

As shown in FIG. 6(c), the anisotropical etching operation is effected with respect to the semiconductor film 407 so as to make portions thin (approximately several 100 Å), existing on the surface of the gate electrode 403 of the semiconductor film 407 and the substrate surface of the active region, while a portion in contact with the side face of the side wall insulating films 404, 404 of the semiconductor film 407 is left thick. The substrate surface of the active region is not exposed, because the damages are not given onto the substrate surface.

As shown in FIG. 6(d), the semiconductor film 407 on the isolation region 415 is removed by the patterning using photolithography, and the etching of RIE or the like. This ensures the insulating property of the source/drain for each device in the completed condition.

As shown in FIG. 6(e), the exposed face of the semiconductor film 407 is oxidized or nitrided by approximately several 100 Å so as to completely change into a protective insulating film 409 portions on the surface of the gate electrode 403 of the semiconductor film 407 and on the substrate surface of the active region, while a portion in contact with the side faces of the side wall insulating films 404, 404 of the semiconductor film 407 is left with some thickness and is made a semiconductor side wall 408. For the later ion implanting step, the above described insulating film 409 is etched so as to have the film thickness into approximately 100 through 300 Å.

As shown in FIG. 6(f), the n type impurities are ion implanted with a large inclined angle (30 through 90 degrees) from the oblique direction with respect to the above described substrate surface with the gate electrode 403, the side wall insulating film 404, 404 and semiconductor side walls 408, 408 as masks. Acceleration energies of the ion implanting operation from the oblique direction are desired to be 60 through 150 keV in a case the ion type of the impurities is $^{31}P+$ and 150 keV through 200 keV in a case where the ion type of the impurities is $^{75}As+$. $1 \times 10^{14}$ cm$^{-2}$ through $1 \times 10^{15}$ cm$^{-2}$ are desired in implanting quantity. Impurity ions stay within the mask in a region where masks 403, 404, 404, 408, 408 exist in accordance with the set value of the acceleration energies, while the impurity ions reach the substrate surface through the insulating film 409 in the active region on both the sides of the semiconductor side walls 408, 408 (in the drawing, regions where the impurities are implanted at this time are shown with 410, 410'). The implanting operation is effected by an implanting system (step implanting) where a total implanting quantity is equally divided (4 through 8 divisions) and the substratum 401 is rotated by quantity where the circumference is divided by division the same as the above described division for each of one division quantity implanting operation. Or the implanting operation is effected by an implanting system (rotation implanting) while the substrate is being rotated at a constant speed. The rotating speed is made approximately 2 rps. In such a case, impurities can be implanted effectively into the whole of the semiconductor side wall 408, especially into a portion adjacent to the substrate surface. As a result, the semiconductor side wall 408 can be made n type in high concentration and also, the n type of region of relatively high concentration can be formed even immediately under the semiconductor side wall 408. In the normal source/drain formation, it is difficult to form a shallow junction by the channeling at the ion implanting operation and by the rapid diffusion by the implanting damages. As the n type region of the relatively high density is formed in the Si substrate 401 with thermal diffusion at the step, a shallow junction can be effectively formed. As the impurities are not directly implanted into the substrate by the existence of the off set by the thickness of the semiconductor side wall 408 in a range where the semiconductor side wall 408 close to the gate electrode 403 has been formed at the ion implanting time, the defects generation close to the channel can be restrained and the reverse short channel effect due to the defect generation can be restrained. The maximum inclined angle of the ion implanting operation may be restricted to approximately 60 degrees from the structure of the Faraday cup of the implanting apparatus. In this case, the implanting operation from the above described oblique direction is set to 60 degrees in maximum inclined angle. The ion type may be made not only the above described $^{75}As+$ and $^{31}P+$, but also $^{122}Sb+$.

As shown in FIG. 6(g), $^{75}As+$ is ion implanted from the approximately vertical direction with respect to the substrate surface with the gate electrode 403, the side wall insulating film 404, 404 and the semiconductor side walls 408, 408 as masks. Acceleration energies are assumed to be approximately 40 through 60 keV. Impurity ions stay within the mask in a region where masks 403, 404, 404, 408, 408 exist in accordance with the set value of the acceleration energies as in the implanting case from the oblique direction, while the impurity ions reach the substrate surface through the insulating film 409 in the active region on both the sides of the semiconductor side walls 408, 408 (in the drawing, regions where the impurities are implanted at this time are shown with 411, 411'). The ion type may be made not only the above described $^{75}As+$ and $^{31}P+$, but also $^{122}Sb+$. Also, the implanting step from the vertical direction may be effected before the implanting step from the oblique direction.

A thermal treating operation is effected so as to diffuse $^{75}As+$ implanted into semiconductor side walls 408, 408 onto the substrate surface so as to form the local shallow source/drain diffusion layer 410, 410' on both the sides of the gate electrode 403, and also, $^{75}As+$ implanted onto the substrate surface on both sides of the semiconductor side wall 408, 408 is activated so as to be coupled onto the side opposite to the gate electrode 403 of the local shallow source/drain diffusing layers 410, 410'. Deep source/drain diffusing layers 411, 411' having a junction depth larger than the junction depth of the local shallow source/drain diffusing layers 410, 410' are formed.

As the impurities are introduced into the substrate surface by the diffusion from the layer (semiconductor side wall 408) upper than the substrate surface in a region where the semiconductor side wall 408 near the gate electrode 403 is formed so as to form the local shallow source/drain diffusing layers 410, 410', influences of the channeling are not given at the ion implanting operation unlike a case where the diffusing layer is formed by the normal ion implanting operation. As the junction is formed by the diffusion from the upper layer of the substrate surface, an extremely shallow junction can be formed so that the short channel effect can be effectively restrained.

Impurities are implanted directly into the substrate through the insulating film 409 at the ion implanting time and are diffused by the thermal treatment in the active regions on both the sides of the semiconductor side walls 408, 408. The source/drain diffusing layers 411, 411' having a junction depth larger than the junction depth of the local shallow source/drain diffusing layers 410, 410' can be formed. A junction depth can be made larger in a region where influences are relatively less upon the short channel effect away from the channel (immediately under the gate electrode 403). As a result, the sheet resistance can be made smaller so as to restrain the increase of parasitic resistance. As the semiconductor side walls 408, 408 function as one portion of the diffusing layers 410, 410' in a region where semiconductor side walls 408, 408 are formed, the resistance increase by the shallow junction can be restrained.

At the ion implanting time, in a region where the semiconductor side wall 408 close to the gate electrode 403 is formed, impurities are not implanted directly into the substrate plate by the existence of an off set by the thickness of the semiconductor side wall 408 so that the defect generation closer to the channel can be restrained and the reverse short channel effect due to the defects generation can be restrained. As carriers are accumulated on the interface on the gate electrode side of the semiconductor side wall by the gate field, mutual conductance can be increased. The current driving force reduction of the device due to the shallow junction can be restrained by these effects so that the device can be driven in high current.

The process is similar to the normal insulating gate type electric field effect transistor forming process before the gate electrode 403 is formed. As the opening portion is not provided in a location of the semiconductor side wall 408, a problem of etching damages or the like such as a case where the conventional recess method is used ((3) method) and a case of the local deposition ((5) method). As the local shallow source/drain diffusing layers 410, 410', and deep splicing source/drain diffusing layers 411, 411' are formed for self-align operation with the gate electrode 403 independently of patterning using the photolithography. Unlike a case of the conventional recess method ((3) method) and a case of the pasting poly Si ((4) method), a problem of characteristic dispersion or the like due to the alignment shifts and the enlargement of the area by the alignment margin is not caused.

A MOSFET for simultaneously realizing the restraint of the short channel effect and the high electric current driving force can be formed by increase in the first photolithography as compared with the normal MOSFET process. The step can be simplified as compared with the case of the conventional local deposition ((5) method).

FIG. 7 and Table 1 show the characteristic data of insulated gate field effect transistors LED (locally Elevated Drain), SLED (Silicided LED) formed in a fifth embodiment, a fourth embodiment in a shape to be compared with conventional field effect transistors LDD (Lightly Doped Drain), Silicided LDD(=SLDD), having the local shallow source/drain diffusing layers of low impurity concentration for making electric field easily, and the SLDD obtained by making the construction of LDD salicided. Parameters or the like used in each of the above described structures are set as follows. In the above described LED, the film thickness of the gate insulation film (SiO$_2$) 402 is made 5 nm, the deposited film thickness of the semiconductor film (poly Si) 407 is made 15 nm. In the ion implanting step from the oblique direction, the ion type of the impurities is made $^{31}$P+, acceleration energy is made 80 KeV, inclination angle 60 degrees, dose quantity $8 \times 10^{14}$ cm$^{-2}$. In the ion implanting step from approximately vertical direction, the ion type is made $^{75}$As+, and the implanting conditions are made 40 KeV in acceleration energy, $5 \times 10^{15}$ cm$^{-2}$ in dose quantity. In the above described SLED, the film thickness of the gate insulating film (SiO$_2$) 302 is made 5 nm, the deposited film thickness of the semiconductor film (poly Si) 307 is made 15 nm. The film thickness of the high melting point metallic film (Ti) 312 is made 50 nm. Silicidation is effected by a so-called AAS ($^{75}$As+ implantation after silicidation) method. In the ion implanting step from the oblique direction, the ion type of the impurities is made $^{31}$P+, acceleration energy is made 120 KeV, inclination angle 60 degrees, dose quantity $8 \times 10^{14}$ cm$^{-2}$. In the ion implanting step from approximately vertical direction, the ion type is made $^{75}$As+, and the implanting conditions are made 150 KeV in acceleration energy, $5 \times 10^{-15}$ cm$^{-2}$ in dose quantity. In the above described LDD, SLDD, the process except for the locally elevated layer (semiconductor side wall) forming process is made the same as that of the above described LED, SLED. The local shallow source/drain diffusing layers of the above described LDD, SLDD are made $^{31}$P+ in the ion type of the impurities, the conditions are set where the acceleration energies are made 30 KeV, dose quantity is $1 \times 10^{13}$ cm$^{-2}$.

Figure 7A:
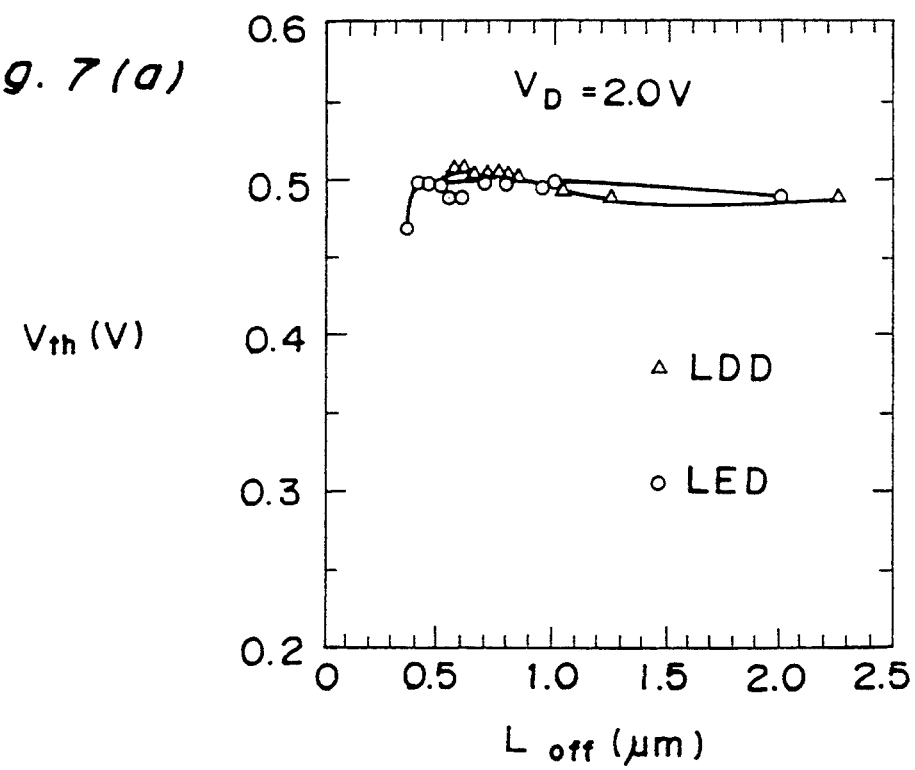
FIGS. 7(a) and 7(b) are views showing the characteristics of an insulated gate field effect transistor fabricated by a forming step of the fifth embodiment, and the fourth embodiment of the present invention.

FIG. 7(a) shows the relationship between the threshold voltage Vth of the above described LED, LDD and the effective channel length (Leff). When the effective channel length Leff is 0.5 μm or more, the roll off characteristic of the LED is made equal to the roll off characteristic of the LDD. The effective channel length Leff cannot be obtained in 0.5 μm or lower, because the ineffective channel length of the LDD becomes negative. In the LED, the roll off characteristic is restrained to 0.3 μm, and is restrained more in the reverse short channel effect than the LDD at less than 0.1 μm. As described already, the defects close to the channel can be restrained by the existence of the off set by the thickness of the semiconductor side wall 408 at the ion implanting time. It is considered that this is the cause of the restriction of the reverse short channel effect.

Table 1 shows series resistance (total of the source side resistance and the drain side resistance) of the above described LED, LDD, SLED and SLDD. The series resistance of the LED, SLED are respectively improved more than the series resistance of the LDD, the SLDD.

The series resistance of the SLED is improved larger than the series resistance of the SLDD, because it is considered that the selicide layer is made closer to the channel in the SLED as compared with the SLDD.

Figure 7B:
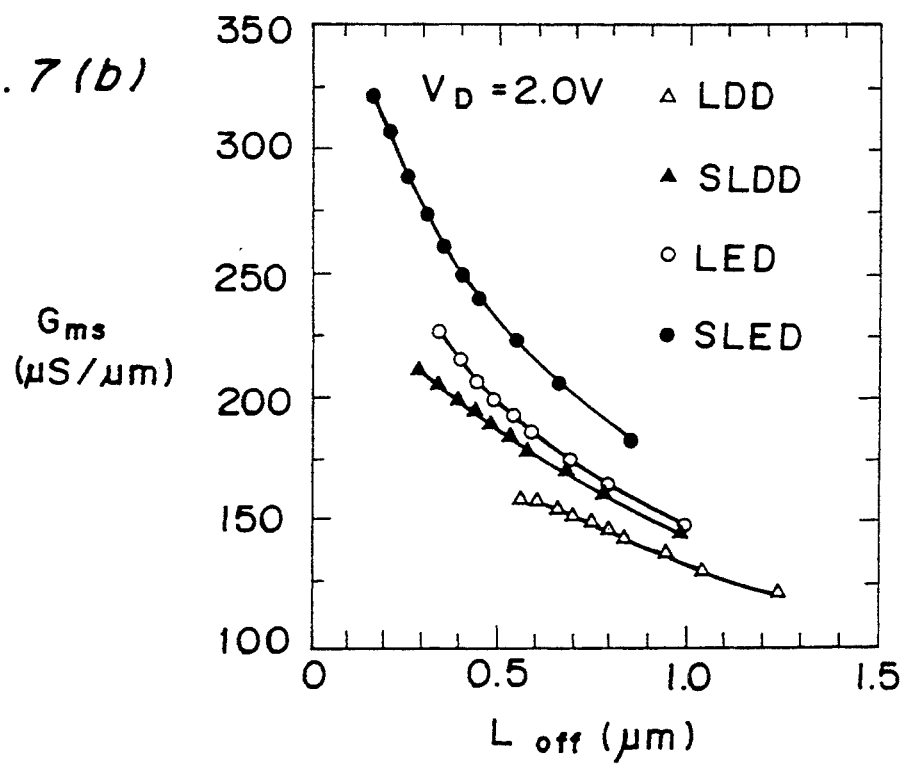
Figure 8:
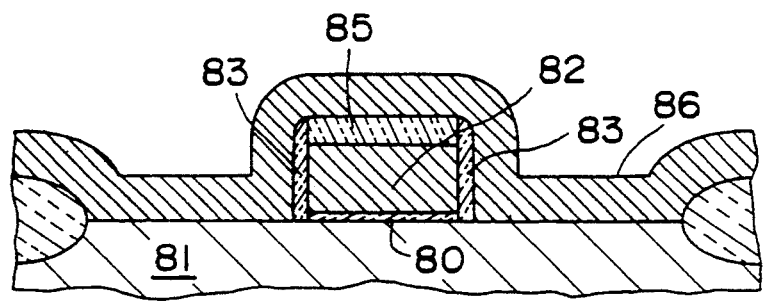
FIGS. 8(a) to 8(d) are views showing a forming step of a semiconductor device by a conventional art.
Figure 8:
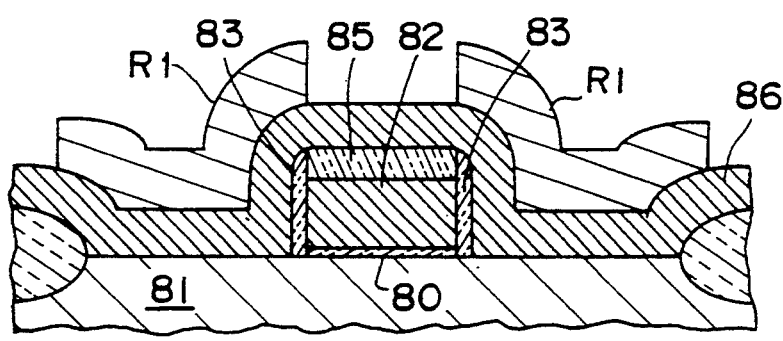
Figure 8:
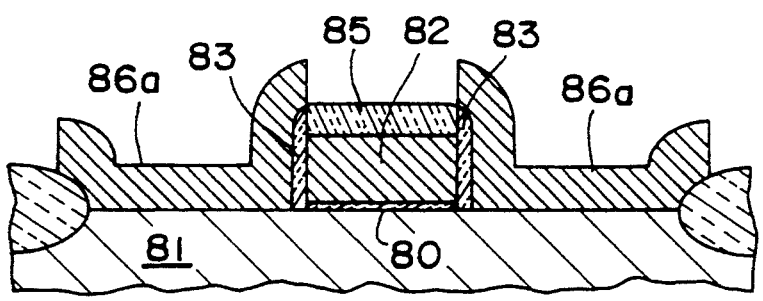
Figure 8:
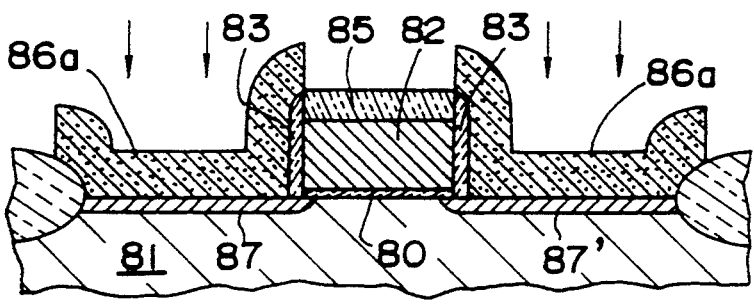
Figure 9A:
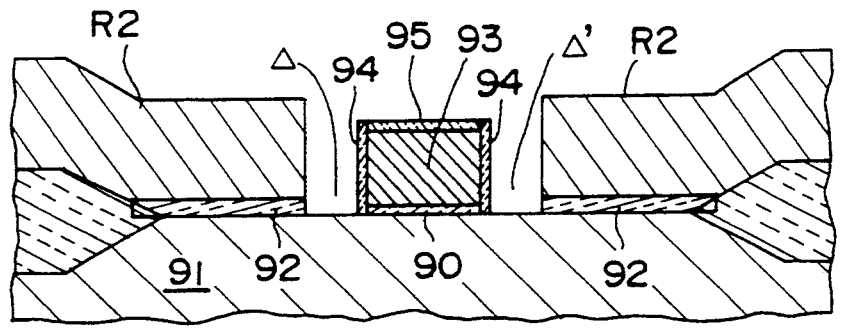
FIGS. 9(a) to 9(d) are views showing a forming step of a semiconductor device by another conventional art.
Figure 9B:
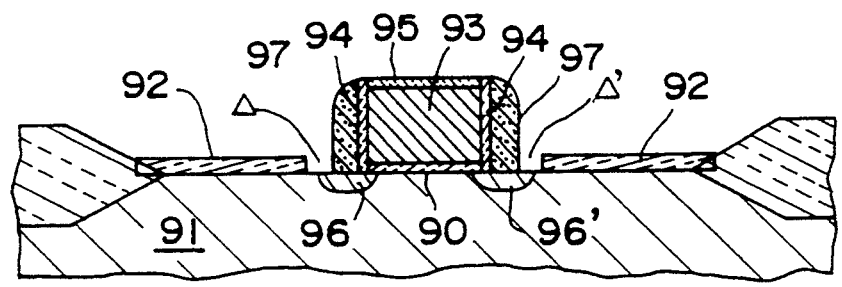
Figure 9C:
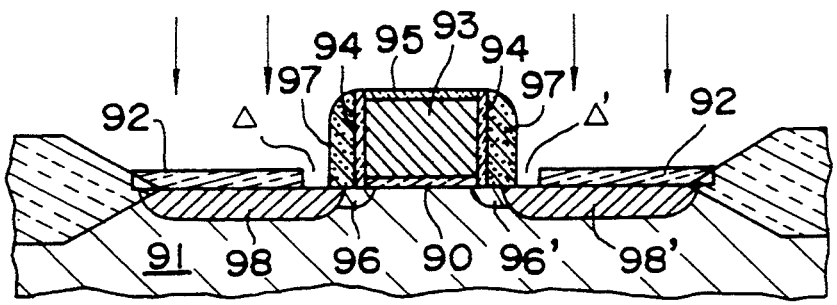
Figure 9D:
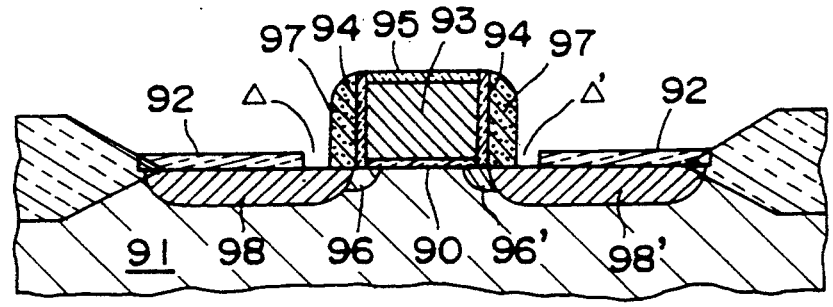

FIG. 7(b) shows the saturation region trans conductance Gms of the above described LED, LDD, SLED and SLDD. The Gms of the LED, SLED are respectively improved more than the Gms of the LDD, SLDD. Especially in the SLED, the maximum mutual conductance 320 μS/μm is achieved in the effective channel length Leff=0.17 μm.

TABLE 1

| Series Resistance | |
|---|---|
| LED | 1440 Ωμm |
| LDD | 1467 Ωμm |
| SLED | 690 Ωμm |
| SLDD | 868 Ωμm |

As is clear from the foregoing description, according to the arrangements of the present invention, a method of forming semiconductor devices described in the first to fourth inventions introduces impurities to the substrate surface on both the sides of the gate electrode so as to form respectively a local shallow source/drain diffusing layer by the diffusion from the semiconductive side wall upper than the substrate surface. Accordingly, the influences of the channeling operation is not given unlike a case where the impurities are introduced by the ion implanting operation. As the junction is formed by the diffusion from the upper layer than the substrate surface so that it is effective in the shallow junction formation. The short channel effect can be restrained by the shallow junction.

As the deep source/drain diffusion layer is formed by the implanting and diffusion onto the normal substrate surface, the shallow junction is not formed so that sheet resistance does not increase. As the semiconductor side wall function as one portion of the diffusion layer in the region where the semiconductor side wall exists, the resistance increase of the diffusing layer by the shallow junction can be restrained.

As the impurities are not implanted directly into the substrate by the existence of the off set by the thickness of the semiconductor side wall in a region where the semiconductor side wall of the gate electrode is formed at the ion implanting operation, the defects generation close to the channel can be restrained and the reverse short channel effect due to the defect caused can be restrained. Carriers are accumulated on the interface on the gate electrode side of the semiconductor side wall by the gate electric field so that the trans-conductance can be increased. The electric current driving force reduction of the devices due to the shallow junction can be restrained due to these effects.

The process is similar to the normal insulated gate field effect transistor forming process before the gate electrode is formed. As the semiconductor side wall covers the opening portion completely or an opening portion is not provided in a location of the semiconductor side wall, a problem of etching damages or the like such as a case where the conventional recess method is used ((3) method) and a case of the local deposition ((5) method). As the local shallow source/drain diffusing layers and deep source/drain diffusing layers are formed for self-align operation with the gate electrode independently of patterning using the photolithography. Unlike a case of the conventional recess method ((3) method) and a case of the pasting poly Si ((4) method), a problem of characteristic dispersion or the like due to the alignment shifts and the enlargement of the area by the alignment margin is not caused. A MOSFET for simultaneously realizing the restraint of the short channel effect and the high electric current driving force can be formed by increase in the first photolithography as compared with the normal MOSFET process. The step can be simplified as compared with the case of the conventional local deposition ((5) method).

In a method of forming semiconductor devices described in the fifth invention, a step of ion-implanting conductive type of impurities different from the conductive type of the substrate into the above described substrate includes a step of implanting them with a given inclination angle from a direction oblique with respect to the substrate surface, and a step of implanting them from the approximately vertical direction with respect to the substrate surface. The impurities can be implanted effectively into the whole of the semiconductor side wall, especially a portion adjacent to the substrate surface from an oblique direction with respect to the above described substrate surface. At a step of implanting them from approximately vertical direction with respect to the above described substrate surface, the impurities can be implanted effectively into the substrate surface of the active area on both the sides of the semiconductor side wall.

In a method of forming the semiconductor devices described in the sixth invention, a layer insulating film is formed on the surface of the above described gate electrode before a processing step of the gate electrode after building up layers of semiconductor films being materials of the gate electrode on the above described active region so that the gate electrode can be protected by the above described layer insulating film in the next step and its subsequent.

In a method of forming the semiconductor devices of the seventh invention, a silicide layer is formed as the above described alloy layer so that the sheet resistance of the semiconductor side wall and the deep source/drain diffusing layer can be reduced, thus making the performance of the device higher. The projection range at the implanting time is reduced by the existence of the silicide layer on the substrate surface so that the channeling can be restrained at a step of implanting the conductive type of impurities different from the conductive type of the substrate into the above described substrate. At this time, the above described deep source/drain diffusing layer is silicidated on surface even if it is shallow junction to some extent, so that the deterioration of the device performance by the increase in the seat resistance and the increase in parasitic resistance can be restrained. The semiconductor side wall adjacent to the gate electrode is silicidated so that the silicide layer can be approached so far as the gate electrode neighborhood and the series resistance value can be reduced.

In the method of forming semiconductor devices described in the eighth invention, after a step of removing the unreactive high melting point metallic film, the second rapid thermal annealing (RTA) is effected so as to stabilize the crystal construction of the above described silicide film. Therefore, the reliability of the device can be improved.

A method of forming semiconductor devices described in the ninth invention is characterized where the semiconductor substrate is composed of a P type silicon, thickness in a direction parallel to the above described substrate surface of the above described semiconductor side walls is made within the range of 500 Å through 2000 Å, an ionic species of the impurities to be implanted is made $^{31}P^+$ when they are implanted into the above described semiconductor side wall from a direction oblique with respect to the above described substrate surface, implanting conditions are set respectively within a range of acceleration energy 40 KeV through 150 KeV, inclination angle 30 degrees through 90 degrees, dose quantity $1 \times 10^{14}$ cm$^{-2}$ through $1 \times 10^{15}$ $cm^{-2}$ so that superior local shallow source/drain diffusing layer can be formed.

A method of forming semiconductor devices described in the tenth invention is characterized where the above described semiconductor substrate is composed of a P type silicon, thickness in a direction parallel to the above described substrate surface of the above described semiconductor side wall is made within the range of 500 Å through 2000 Å, an ionic species of the impurities to be implanted is made $^{75}As^+$ when they are implanted into the above described semiconductor side wall from a direction oblique with respect to the above described substrate surface, implanting conditions are set respectively within a range of acceleration energy 150 KeV through 300 KeV, inclination angle 30 degrees through 90 degrees, dose quantity $1 \times 10^{14}$ $cm^{-2}$ through $1 \times 10^{15} cm^{-2}$ so that a superior source/drain diffusing layer can be formed.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be constructed as included therein.

What is claimed is:

1. A method of forming semiconductor devices comprising the steps of:

blocking the surfaces of a semiconductor substrate having a conductivity type so as to form active regions and forming an approximately rectangular gate electrode on a gate insulating film in an approximate center of the active region;

forming a side wall insulating film on both the side faces of the gate electrode;

accumulating a semiconductor film to approximately uniform thickness on the gate electrode, side wall insulating film and substrate;

effecting an anisotropical etching operation with respect to the semiconductor film so as to leave thin portions thereof existing on the surface of the gate electrode and the substrate surface of the active region of the semiconductor film, while leaving a thick portion in contact with the side face of the side wall insulating film of the semiconductor film;

oxidizing or nitriding the exposed faces of the semiconductor film so as to change portions, existing on the surface of the gate electrode and the substrate surface of the active region of the semiconductor film into a protective insulating film, while leaving a portion in contact with the side face of the side wall insulating film of the semiconductor film of a thickness so as to form semiconductor side walls;

introducing conductive type impurities different from the conductive type substrate, using the gate electrode, the side wall insulating film and the semiconductor side wall as masks, said step of introducing impurities includes implanting ions into the substrate, with accelerating energies reaching the substrate surface through the protective insulating film in the active regions on both the sides of the masks; and effecting a thermal treating operation, diffusing impurities implanted into the semiconductor side wall into the substrate surface, forming a local shallow source/drain diffusing layer on both the sides of the gate electrode, and also, activating impurities implanted into the substrate surface in the active regions on both the sides of the masks, coupling to a side opposite to the gate electrode of the local shallow source/drain diffusing layer so as to form a deep source/drain diffusing layer having a junction depth deeper than the junction depth of the local shallow source/drain diffusing layer.

2. The method of forming semiconductor devices as defined in claim 1 where the step of introducing conductive type impurities comprises a step of implanting at an oblique direction with respect to the substrate surface and a step of implanting from an approximately vertical direction with respect to the substrate surface.

3. The method of forming semiconductor devices as defined in claim 2, comprising the steps of having the semiconductor substrate made of a P type silicon, forming the gate electrode to have a thickness in a direction perpendicular to the substrate surface within the range of 1000 Å through 2000 Å, wherein the step of implanting at an oblique direction comprises implanting ionic pieces of impurities $^{31}P^+$ at a range of acceleration energy of 40 KeV through 150 KeV, an inclination angle 30 degrees through 90 degrees, and a dose quantity of $1 \times 10^{14}$ $cm^{-2}$ through $1 \times 10^{15}$ $cm^{-2}$.

4. The method of forming semiconductor devices as defined in claim 2, comprising the steps of having the semiconductor substrate made of a P type silicon, forming the gate electrode to have a thickness in a direction perpendicular to the substrate surface within the range of 1000 Å through 2000 Å, wherein the step of implanting at an oblique direction comprises implanting ionic species of impurities $^{75}As^+$ at a range of acceleration energy of 150 KeV through 300 KeV, an inclination angle of 30 degrees through 90 degrees, and a dose quantity of $1 \times 10^{14}$ $cm^{-2}$ through $1 \times 10^{15}$ $cm^{-2}$.

* * * * *

UNITED STATES PATENT AND TRADEMARK OFFICE
CERTIFICATE OF CORRECTION

PATENT NO. : 5,391,508
DATED : February 21, 1995
INVENTOR(S) : Toshimasa MATSUOKA et al.

It is certified that error appears in the above-indentified patent and that said Letters Patent is hereby corrected as shown below:

<u>Column 8</u>

Line 36, change "pieces" to --species--.
Line 52, change "pieces" to --species--.

<u>Column 11</u>

Line 3, change "pieces" to --species--.

<u>Column 34</u>

Line 37, change "pieces" to --species--.

Signed and Sealed this

Thirteenth Day of June, 1995

Attest:

BRUCE LEHMAN

Attesting Officer    Commissioner of Patents and Trademarks